(12) United States Patent
Ryan et al.

(10) Patent No.: US 6,347,919 B1
(45) Date of Patent: Feb. 19, 2002

(54) WAFER PROCESSING CHAMBER HAVING SEPARABLE UPPER AND LOWER HALVES

(75) Inventors: Kevin Thomas Ryan, Wilmington; Peter Lawrence Kellerman, Essex; Frank Sinclair, Quincy; Ernest Everett Allen, Rockport; Roger Bradford Fish, Bedford, all of MA (US)

(73) Assignee: Eaton Corporation, Cleveland, OH (US)

( * ) Notice: Subject to any disclaimer, the term of this patent is extended or adjusted under 35 U.S.C. 154(b) by 0 days.

(21) Appl. No.: 09/466,416

(22) Filed: Dec. 17, 1999

(51) Int. Cl.$^7$ .............................. B65G 49/07; F16K 3/00
(52) U.S. Cl. ...................... 414/217; 414/805; 414/939; 251/326; 251/329
(58) Field of Search ................................ 414/217, 939, 414/805; 251/326, 329

(56) References Cited

U.S. PATENT DOCUMENTS

| | | | |
|---|---|---|---|
| 4,809,950 A | * 3/1989 | Geiser | 251/326 X |
| 5,150,882 A | * 9/1992 | Kaneko | 251/193 |
| 5,607,276 A | 3/1997 | Muka et al. | |
| 5,609,459 A | 3/1997 | Muka | |
| 5,613,821 A | 3/1997 | Muka et al. | |
| 5,664,925 A | 9/1997 | Muka et al. | |
| 5,765,983 A | 6/1998 | Caveney et al. | |
| 5,769,952 A | * 6/1998 | Komino | 251/193 X |
| 5,961,269 A | * 10/1999 | Kroeker | 414/939 X |
| 6,048,154 A | * 4/2000 | Wytman | 414/939 X |

* cited by examiner

Primary Examiner—Steven A. Bratlie
(74) Attorney, Agent, or Firm—Eschweiler & Associates, LLC

(57) ABSTRACT

A wafer processing apparatus includes a processing chamber having a top chamber portion and a bottom chamber portion, respectively. The apparatus further includes an annular ring valve associated with one of the top chamber portion and the bottom chamber portion which is operable to close the processing chamber for processing in a first position and open the processing chamber for access thereto in a second position. The ring valve, in the first position, provides a substantially uniform surface about an inner periphery of the closed processing chamber, and thereby facilitates uniform processing conditions. A method of accessing a wafer processing apparatus is also disclosed and includes moving an annular ring valve within a processing chamber between two positions. In the first position the annular ring valve sealingly blocks an access port of the processing chamber and thereby prohibits access thereto, and in the second position the annular ring valve does not block the access port, and permits access to the processing chamber. The annular ring valve has a substantially uniform inner peripheral surface, and thereby facilitates uniform processing conditions within the processing chamber when in the first position.

59 Claims, 15 Drawing Sheets

WAFER PROCESSING CHAMBER HAVING SEPARABLE UPPER AND LOWER HALVES

FIELD OF THE INVENTION

The present invention relates generally to semiconductor processing systems, and more specifically to a system and method for transferring a wafer or other planar type substrate to a processing apparatus.

BACKGROUND OF THE INVENTION

The fabrication of integrated circuits and other type devices typically employs a series of fabrication steps in which a semiconductor wafer or other type substrate is processed within various processing systems. For example, a semiconductor wafer is subjected to photoresist and other film depositions and patterning steps, implantation and diffusion type processing, etc. The diverse processing steps are executed in a variety of different processing systems, for example, photoresist ashing systems, dry etch systems, ion implantation systems, chemical vapor deposition systems, etc. For each of the above processing systems, control of contamination is imperative for a cost-effective, reliable manufacture of such devices. Furthermore, because design rules for integrated circuits require ever-decreasing critical dimension feature sizes, it is necessary to provide improved control over particulate contamination within such systems.

Some of the primary sources of particulate contamination in integrated circuit processing are personnel, equipment and chemicals. Particulates generated or "given-off" by personnel are transmitted through the processing environment and may result undesirably in device defects. Particulates within the equipment and chemicals associated therewith are often called process defects and are caused by frictional contact between surfaces in the equipment and impurities within the supply gases or chemicals. One significant source of such process defects is contamination associated with the storage transportation of wafers from one processing system to another.

Various mechanisms have been developed to isolate the wafer from particles during the storage, transport and processing of wafers in the processing equipment. For example, the Standard Mechanical Interface (SMIF) system has been created to reduce particle contaminations.

In a typical SMIF system, a box or carrier is placed at the interface port of the processing apparatus; latches release the box door and port door simultaneously. The doors on the carrier mate with the doors on the interface port of the processing equipments and open simultaneously so that particles which may have been on the external door surfaces are trapped between the doors and thus do not contaminate the processing chamber.

Regardless of the various attempts made to minimize process defects, contamination problems still persist. Another method of reducing process defects associated with such contamination is by constantly evacuating and re-pressurizing the process chamber as wafers are transferred thereto and therefrom. A method for effectuating such contamination reduction is illustrated in prior art FIG. 1 and designated generally at reference numeral 10. Typically, a multi-wafer cassette is located local to the processing chamber at ambient atmosphere, while a wafer within the process chamber is processed at a substantially reduced pressure, for example, about 1 millitorr at step 12. After the processing is complete, the wafer is removed at step 14 by opening the process chamber to allow transfer of the processed wafer back into the multi-wafer cassette.

Subsequent to the wafer removal, the process chamber is pumped down to a pressure significantly lower than the processing pressure, for example, about 1 microtorr at step 106 in order remove any contamination that may have been introduced by opening the chamber door. A load lock valve is then opened and a new wafer is then loaded into the process chamber at step 18. The load lock valve is then closed and the chamber is again pressurized to the desired process pressure at step 20. Although the above method 10 generally is effective at minimizing contamination to a reasonable level, the method 10 involves "pump and vent" cycles between the loading of each wafer into the chamber which negatively impacts processing throughput. As is well known to those skilled in the art, because processing equipment is a significant capital expenditure, low equipment throughput is highly undesirable.

Another problem associated with certain types of semiconductor processing equipment is related to the doorway or access port into the process chamber. Typically a wafer transfer endstation mates with a rectangular or box-like doorway or access port of the process chamber. The process chamber isolates the internal portion of the chamber from the outside environment during processing by actuating a slot valve associated with the access port. The slot valve-access port interface, however, results in an asymmetry within the process chamber which in some processes, for example, plasma immersion ion implantation, may result in temperature variation, plasma density non-uniformity and other type non-uniformities within the process. Such non-uniformities may negatively impact process control and the like.

There is a need in the art for a semiconductor processing system and method which minimizes process chamber contamination, increases wafer throughput and improves semiconductor process control.

SUMMARY OF THE INVENTION

The present invention is directed to a wafer processing system which efficiently handles the transfer of wafers to and from a wafer processing chamber in a manner which reduces chamber contamination, increases wafer throughput and improves process control.

According to one aspect of the present invention, a wafer processing system and associated method is disclosed which efficiently handles the transfer of a wafer to and from a wafer processing chamber without requiring an evacuation of the processing chamber for each wafer transfer. The system includes a load lock chamber, a process chamber and a transfer chamber therebetween. A portion of the load lock chamber is sealed or otherwise isolated from the transfer chamber and the process chamber when a wafer is transferred thereto. The load lock chamber portion is then evacuated or otherwise pumped to substantially equalize the pressure between the load lock chamber portion and the remaining portion of the load lock chamber, transfer chamber and process chamber. Upon pressure equalization, the load lock chamber portion containing the wafer is brought into fluid communication with the transfer chamber and the process chamber, and the wafer is transferred to the processing chamber via the transfer chamber. According to the present invention, the use of one or more such load lock chambers allows transfer of wafers to the process chamber without the need for an evacuation thereof, thereby minimizing process chamber contamination and increasing wafer throughput.

According to another aspect of the present invention, a ring valve and associated method is disclosed. The ring valve resides within or is otherwise associated with the process chamber and is operable to move between an open and closed position therein to selectively seal the process chamber from the remainder of the wafer processing system. In the open ring valve position, the interior of the processing chamber forms a top chamber portion and a bottom chamber portion defining an annular spacing therebetween. In the open position, the ring valve exposes a process chamber access port at a portion of the annular spacing through which the transfer chamber is coupled and the process chamber is accessed. In the closed position, the ring valve couples the top and bottom interior chamber portions together, thereby sealing the processing chamber from the transfer chamber and load lock chamber, respectively. In addition, the ring valve has a substantially uniform interior peripheral surface which provides a peripheral uniformity within the processing chamber, thereby facilitating uniform processing conditions therein.

According to yet another aspect of the present invention, a single axis wafer movement transfer arm and associated method of wafer transfer is disclosed. The transfer arm avoids the multi-axis, multi-jointed articulated robotic arms of prior art systems, thereby reducing the particle generation and contamination associated therewith. The transfer arm includes an elongate member which is rotatably coupled to a portion of the transfer chamber about an axis which permits rotational movement of the transfer arm between the load lock chamber and the process chamber. Preferably, the arm is rotatably coupled to the transfer chamber at a midpoint thereof and contains end effectors at each end for simultaneous wafer transfer between the process chamber and the load lock chamber in an efficient manner.

Preferably, the transfer arm of the present invention is utilized in conjunction with a dual load lock chamber processing system arrangement. In such case, two such transfer arms are implemented and rotate about separate axes to and from the process chamber from separate load lock chambers. That is, one transfer arm rotates about a first axis while the other transfer arm rotates about a second axis. In the above manner, one load lock chamber may be loaded externally with a wafer and undergo a pump and vent cycle while the other load lock chamber is transferring and receiving thereto wafers with the process chamber. In the above manner, wafers are transferred to and from the process chamber in an efficient manner without substantial contamination associated therewith, thereby improving process yield and throughput.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

Figure 1:
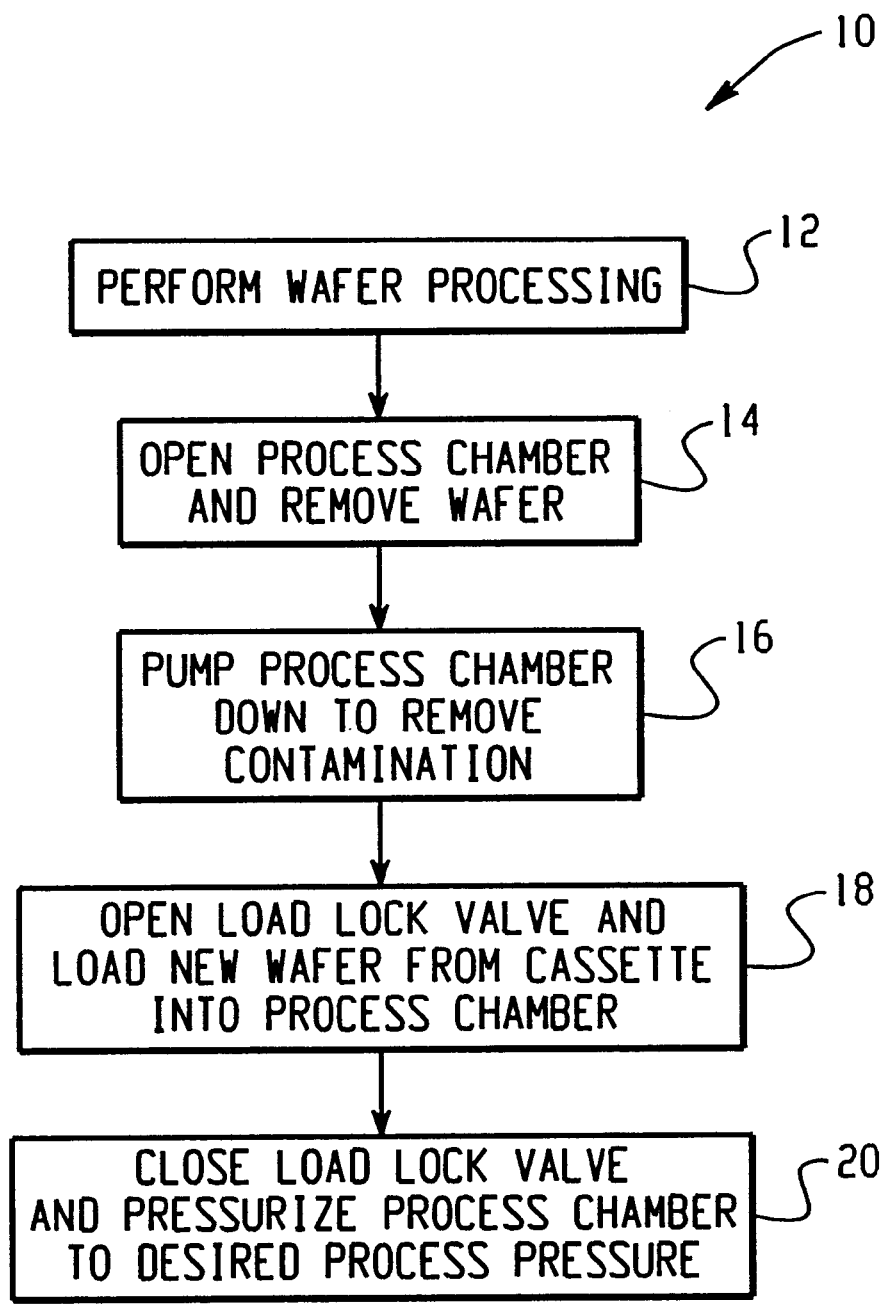
FIG. 1 is a flow chart diagram illustrating a prior art method of transferring a wafer to a wafer processing chamber, wherein the process chamber undergoes a pump and vent cycle for each wafer transferred thereto.

The present invention will now be described with reference to the drawings wherein like reference numerals are used to refer to like elements throughout. The present invention includes a wafer process chamber, wafer handling system and associated method which incorporates several inventive features that improve the throughput of the wafer processing system, reduce contamination associated with wafer handling and transfer, and improve process control therein.

The present invention includes a ring valve in conjunction with the process chamber. The ring valve extends peripherally throughout a portion of the process chamber and is operable to move between an open position and a closed position, wherein in the open position an access port is revealed or otherwise defined which allows a wafer to enter or exit the process chamber. In the closed position, the ring valve effectively closes the access port and provides a substantially uniform surface about an interior peripheral portion of the process chamber, thereby facilitating uniform processing conditions within the process chamber and improving process control.

In addition, the present invention provides for single axis wafer movement between a load lock chamber and a process chamber via a non-jointed wafer transfer arm. The transfer arm preferably includes an elongate transfer member which is rotationally coupled to an axis point in a transfer chamber. The elongate transfer member includes end effectors or other type wafer contact manipulators generally at each distal end thereof which rotate in a wafer transfer plane between a neutral position in the transfer chamber and wafer engagement positions (transfer positions) in the load lock chamber and process chamber to transfer wafers therebetween. Due to the single axis rotation, the non-jointed transfer arm of the present invention reduces substantially the number of moving parts which frictionally engage one another, and thereby reduces particle contamination associated therewith, and allows the system to keep process gas in the transfer chamber at the same pressure as the process chamber.

Accordingly, the present invention further includes a load lock chamber and transfer chamber associated with the process chamber which allows for selective fluid isolation between the load lock chamber and the process chamber. Consequently, wafers may be transferred to the process chamber via the transfer arm without having to pump and vent the process chamber for each wafer transfer, thereby reducing contamination associated therewith and increasing system throughput.

The various features of the present invention will be described below in conjunction with a plasma immersion ion implantation system as an exemplary embodiment. It should be understood, however, that the present invention may also be used in conjunction with other type semiconductor or other type substrate processing systems (e.g., photoresist ashing systems, dry etch systems, ion implantation systems, chemical vapor deposition systems, etc.) and such systems are contemplated as falling within the scope of the present invention.

Figure 2:
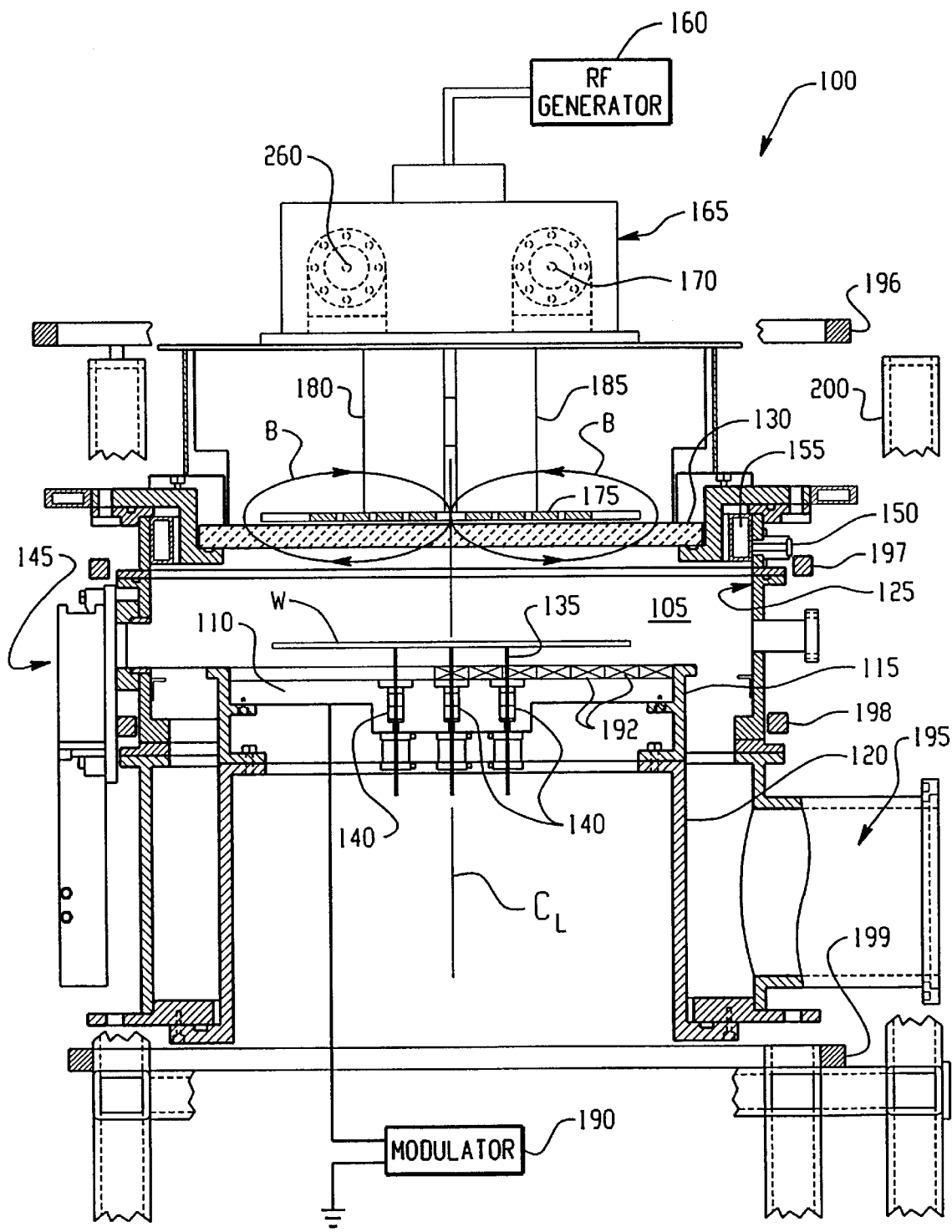
FIG. 2 is a cross sectional view of an exemplary plasma immersion ion implantation system.

Referring now to the drawings, FIG. 2 discloses an exemplary conventional plasma immersion ion implantation system, and is generally designated at reference numeral 100. The system 100 includes an evacuated process chamber 105 that is defined by an electrically activatable wafer support platen 110 mounted on an insulator 115, an electrically grounded chamber housing 120 having walls 125 associated therewith, and a quartz window 130. Plasma which is generated within the chamber 105 contains ions of a desired dopant species (e.g., arsenic) that are implanted into a substrate, such as a semiconductor wafer W located therein, when a negatively charged voltage is applied to the platen 110. As shown in FIG. 2, the wafer W is lifted off of the platen by pins 135 operated by pin assemblies 140. In this manner the wafer may be positioned vertically in a wafer transfer plane and installed into and removed from the plasma chamber via an access port 145 and a load lock assembly (not shown).

The plasma is generated in the process chamber 105 as follows. An ionizable dopant gas is introduced into the process chamber 105 by means of an inlet 150 and a perforated annular channel 155 that resides about the upper periphery of the chamber. A radio frequency (RF) generator 160 generates an RF signal (on the order of 13.5 megahertz (MHz)) which is coupled to a matching network 165. The matching network includes capacitors 170 that capacitively couple the RF signal to a generally planar antenna 175, having inner and outer circular coils, via leads 180 and 185. Matching the impedance of the RF generator 160 with the load impedance insures maximum power out of the antenna 175 by minimizing reflection of the RF signal back into the generator. One such type of matching network 165 is known as an "inverted L" network, wherein the capacitance of the capacitors 170 is varied by servomotors, depending upon operating conditions.

The RF current generated within the antenna 175 creates a magnetic field that passes through the quartz window 130 into the process chamber 105. The magnetic field lines are oriented in the direction shown by arrows B, based on the direction of current through the antenna coils. The magnetic field penetrating the process chamber 105 through the quartz window 130 induces an electric field in the process chamber.

This electric field accelerates electrons, which in turn ionize the dopant gas, which is introduced into the chamber through the annular channel 155, to create a plasma. The plasma includes positively charged ions of the desired dopant that are capable of being implanted into the wafer W when a suitable opposing voltage is applied to the platen 110 by the modulator 190. Because the implantation process occurs in a vacuum, the conventional process chamber 105 is evacuated by pumps (not shown) via the pump manifold 195.

Electromagnetic coils 196, 197, 198, and 199 are located outside of the process chamber 105. The purpose of the coils is to vary the magnetic field within the process chamber 105 to vary the plasma diffusion rate, which alters the radial distribution of plasma density across the surface of the wafer, to insure a uniform implant of ions across the surface of the wafer W. The electromagnetic coils of FIG. 2 include two larger main coils 196 and 199 disposed above and below, respectively, and two smaller trim coils 197 and 198, which reside closer in proximity to the process chamber 105. In addition, the wafer platen 110 includes a dosimetry detector such as a plurality of Faraday current collectors or cups 192 that are used to measure plasma current density and thereby provide an indication of implant dose.

The process chamber 105 of FIG. 2 suffers from a non-uniformity within the chamber which negatively impacts process condition uniformity therein. In particular, the access port 145 for receiving wafers for processing includes an OEM slot valve, which is a valve having a generally rectangular opening which mounts to the box-like access port opening 255 in the process chamber 105. The opening in the slot valve disturbs the cylindrical shape in an interior peripheral portion of the process chamber 105 which may cause non-uniformities in the process conducted therein. For example, in the plasma immersion ion implantation type chamber 105, the disturbance (non-uniformity) disrupts the plasma density uniformity therein, thereby resulting in potential implantation variations across the wafer.

Figure 3:
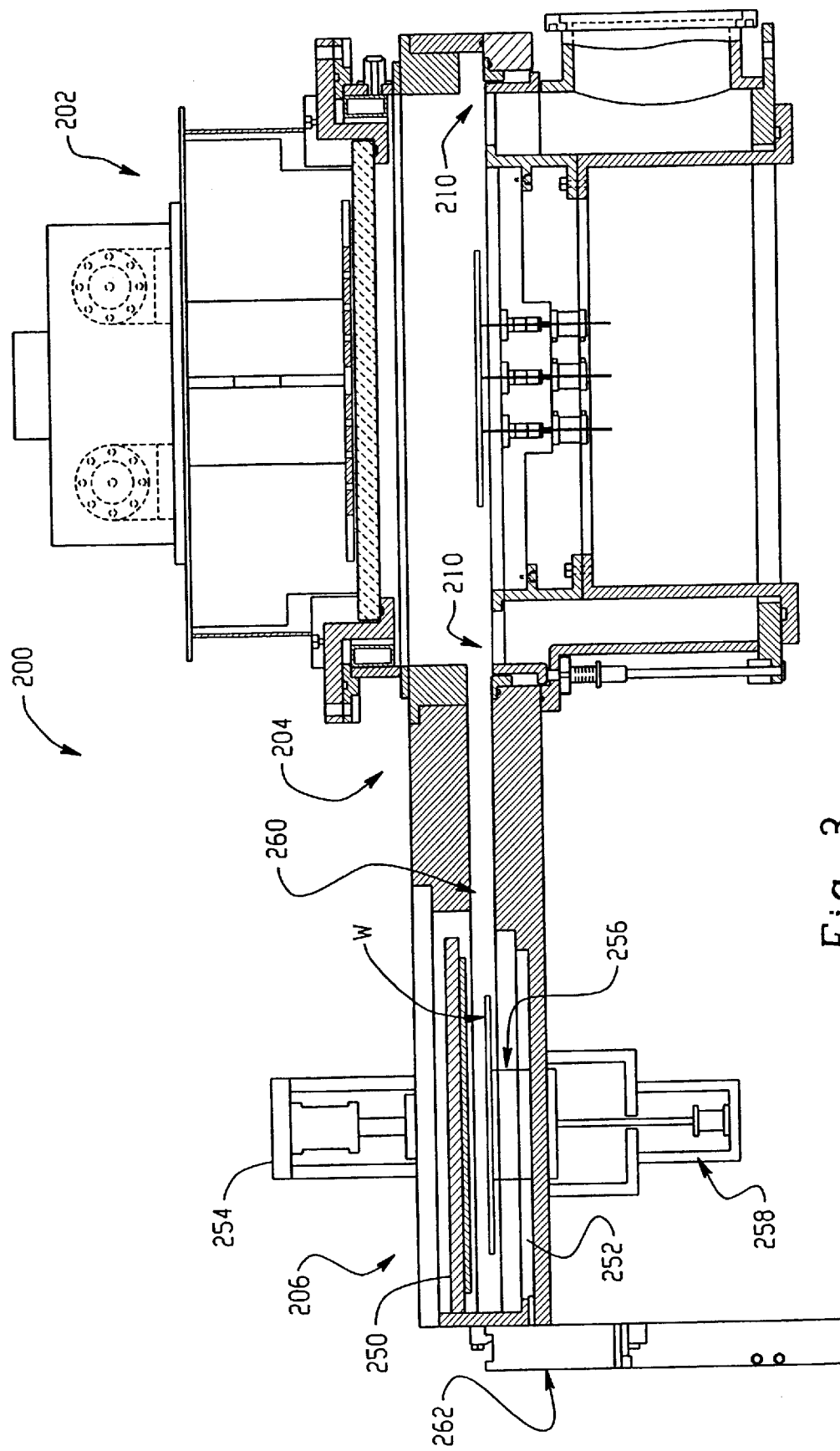
FIG. 3 is a system level cross sectional view illustrating a ring valve and multichamber processing system for eliminating process chamber pump and vent cycles according to the present invention.
Figure 4A:
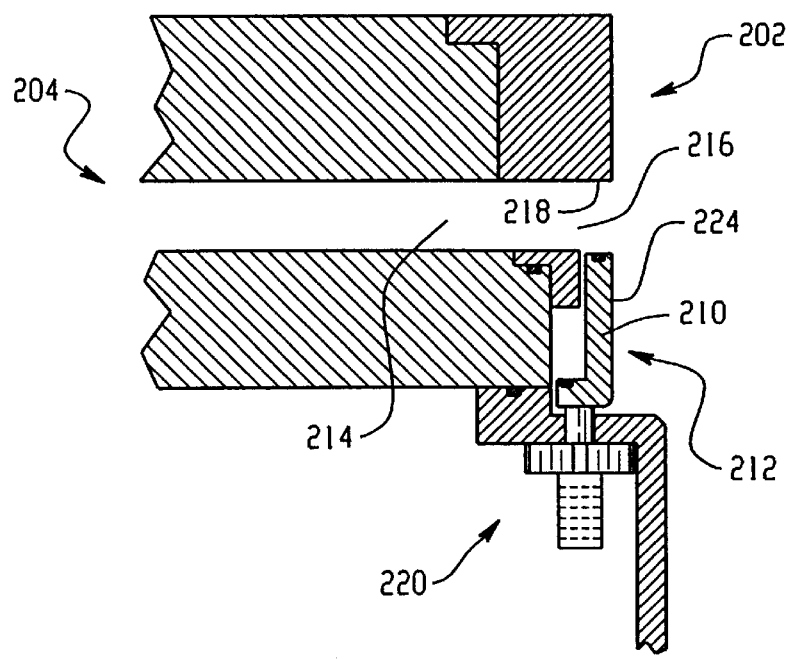
FIG. 4a is an exploded, fragmentary cross sectional view of a portion of the process chamber of FIG. 3, wherein a ring valve is illustrated in an open, retracted position.
Figure 4B:
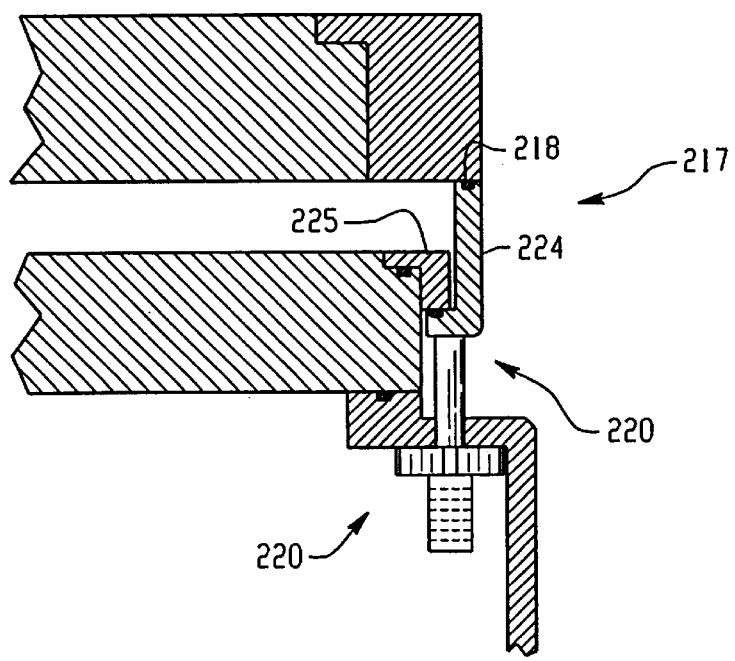
FIG. 4b is an exploded, fragmentary cross sectional view of a portion of the process chamber of FIG. 3, wherein a ring valve is illustrated in a closed position to seal the process chamber.

The present invention overcomes the disadvantages associated with the prior art slot valve discussed above by employing an annular ring valve within the wafer process chamber. An exemplary ring valve and associated wafer processing system is illustrated in FIGS. 3 and 4a–4b. In FIG. 3, a wafer processing system 200 includes a process chamber 202, a wafer transfer chamber 204, and a load lock chamber 206, respectively. The process chamber 202 is similar to the chamber 105 of FIG. 2 in many respects, however, the rectangular slot valve is replaced with an annular ring valve, designated at reference numeral 210 which peripherally encircles a generally middle interior portion of the process chamber 202.

The ring valve 210 is operable effectively to open and close the process chamber 202 by moving between a first, open position (a retracted position) and a second, closed position (an extended position). As illustrated in FIG. 4a, in a first, open position 212, the ring valve 210 is in a retracted position and resides within an annular lip of the process chamber 202, thereby opening a chamber access slot 214 and placing a chamber interior region 216 in fluid communication with the transfer chamber 204. In the open position 212, a wafer may enter or exit the process chamber 202 in one of many ways. For example, a wafer may enter or exit the process chamber 202 using a multi-axis, multi-jointed articulated transfer arm to transfer a wafer to and from the process chamber 202. Alternatively, wafer transfer may be effectuated using a transfer arm employing a single axis wafer movement to and from the process chamber 202, as will be described in greater detail infra.

The second, closed ring valve position is illustrated in FIG. 4b, designated at reference numeral 217 in which the ring valve 210 sealingly engages a top interior portion 218 of the process chamber 202 about a periphery thereof. Simultaneously, when in the closed position, a bottom portion of the ring valve 210 engages a portion 225 of the process chamber 202 to seal the process chamber from the transfer chamber. Preferably, the ring valve 210 is actuated and thereby moved between the open and closed positions via an actuation member 220 which selectively exerts a force upon a bottom portion 220 of the ring valve 210, as may be desired. According to one exemplary embodiment of the present invention, the actuation member 220 includes an internally threaded screw/bore arrangement in which the rotation of an internal screw member within a threaded bore results in a variation in the vertical position of the ring valve 210 within the process chamber 202. Alternatively, for example, a bellow type fluid actuator may be implemented. Any manner of actuating or otherwise manipulating the vertical position of the ring valve 210 may be utilized and any such actuation device or system is contemplated as falling within the scope of the present invention.

In the second, closed position 217, as illustrated in FIG. 4b, the ring valve 210 seals or otherwise fluidly isolates the process chamber 202 from the transfer chamber 204. In this manner, the ring valve 210 prevents the plasma (or other type processing environment) to generate deposits or otherwise affect the wafer transport system 204 associated with the transfer chamber 204. The ring valve 210 generally is annular in shape and preferably contains a substantially uniform inner peripheral surface 224. Consequently, when in the closed position 217, the access port 214 associated with the process chamber 202 is covered and a substantially uniform periphery exists therein, thereby facilitating uniform processing conditions within the process chamber 202. In particular, with regards to a plasma immersion ion implantation apparatus, the substantially uniform inner peripheral surface 224 of the ring valve 210 facilitates a uniform plasma density throughout the process chamber 202, thereby providing a more uniform ion implantation across the surface of the wafer W.

According to a preferred embodiment of the present invention, the ring valve 210 sealingly engages a top interior portion 218 of the chamber 202 in a center portion thereof and thus defines a top portion and a bottom portion of the process chamber, respectively. Preferably, the ring valve 210 is associated with the bottom portion of the process chamber 202 as illustrated in FIGS. 3–4b; that is, the actuator member 220 which manipulates the ring valve 210 is associated with the bottom portion of the process chamber 202. Alternatively, however, the present invention contemplates the ring valve 210 being associated with the top process chamber portion. For example, in such an embodiment the actuator member 220 may be attached to the ring valve 210 and operate to effectively lower a suspended ring valve 210 down from a first, open position to a second, closed position which sealingly engages a bottom interior portion 225 of the process chamber 202.

In addition, the ring valve 210 preferably is composed of a material which is the same or similar to the process chamber composition. Thus, the ring valve 210 preferably exhibits a coefficient of thermal expansion which approximates that of the process chamber 202, thus maintaining an effective sealing engagement for the chamber when the valve 210 is in the closed position over a plurality of process temperatures.

According to another aspect of the present invention, the wafer processing system 200 of FIG. 3 provides a transfer chamber 204 in conjunction with the load lock chamber 206 and the process chamber 202 which improves system operation by reducing process chamber contamination. The contamination improvement is effectuated by providing for a wafer transport to the process chamber which does not require a process chamber pump and vent cycle for each wafer transport as in prior art systems. Therefore the wafer processing system 200 allows the process chamber 202 to be maintained at the process environment pressure at all times throughout the wafer transport process. Such feature also advantageously allows wafer processing to commence expediently since the process chamber pressure is maintained during wafer transport.

The system 200 of FIG. 3 includes the load lock chamber 206 having a load lock cover 250 which is operable to move between two positions: a first, closed position in which the load lock cover 250 is lowered within a shallow T-shaped recess 252 and sealingly engages and thereby isolates a portion of the load lock chamber 250 (corresponding to the recess 252) from the transfer chamber 204, and a second, open position (as illustrated in FIG. 3) wherein the load lock cover 250 is lifted or otherwise moved out of the recess 252 in order to bring the recess portion 252 of the load lock chamber 206 into fluid communication with the transfer chamber 204.

The load lock chamber 206 further includes a load lock cover actuator 254 which is operatively coupled to the load lock cover 250 and operable to move the load lock cover 250 between the open and closed positions, respectively. Any actuation mechanism may be utilized and is contemplated by the present invention. In addition, the load lock chamber 206 includes a plurality of pins 256 operated by a pin assembly 258 to position the wafer W vertically into a wafer transfer plane 260. Lastly, the load lock chamber 206 includes a pump (not shown) associated therewith which is operable to pump down the recess portion 252 down to a processing pressure (e.g., about 1 millitorr) prior to transferring the wafer W to the process chamber 202.

The system 200 operates in the following manner. The load lock cover 250 is initially in a closed position, wherein the cover 250 is sealingly engaged with the shallow T-shaped recess 252, via the actuator 254. Thus, the recess portion 252 is fluidly isolated from the transfer chamber 204. A wafer W is the input into the recess 252 via a side access port 262. Upon closing the port 262, the pump (not shown) pumps down the pressure in the recess 252 (i.e., evacuates the recess region) down to the desired process environment pressure. Upon reaching the desired pressure, the load lock cover 250 is lifted via the actuator 254, thereby placing the recess 252 in fluid communication with the transfer chamber 204.

Operation continues by actuating the pins 256 via the pin assembly 258, wherein the pins 256 contact a bottom portion of the wafer W and lift the wafer into the wafer transfer plane 260. A wafer transfer assembly (not shown in FIG. 3) then takes the wafer W from the load lock chamber 206 and transfers the wafer W to the process chamber 202 (after opening the ring valve 210 associated therewith). Upon the wafer W entering the process chamber 202 and the wafer transfer assembly exiting the process chamber 202, the ring valve 210 is moved to the closed position, thereby fluidly isolating the process chamber interior from the transfer chamber 204. Since the transfer chamber 204 has remained at its process pressure throughout this entire process, processing can commence therein immediately without a pump and vent cycle associated therewith, thereby decreasing contamination within the process chamber 202 and improving throughput.

The above feature has been described in conjunction with a single load lock chamber 206, however, the present invention contemplates such operation with multiple load lock chambers, preferably two such chambers 206. In such a case, while a wafer is being transferred from one load lock chamber to the processing chamber for processing, the second load lock chamber concurrently contains a wafer and is pumping down to the processing pressure. Consequently, as soon as a wafer is removed from the process chamber 202, another is immediately transferred thereto from the second load lock chamber, thereby substantially increasing the system throughput while minimizing process chamber contamination since the pump and vent cycle associated with either load lock chamber does not adversely impact a wafer processing and transfer cycle time.

Another aspect of the present invention relates to a wafer transfer apparatus for transferring a wafer W from a load lock chamber to a process chamber in an efficient, reliable manner. As will become evident in the discussion below, the wafer transfer apparatus of the present invention reduces the number of moving, frictionally engagable components over prior art systems and thereby reduces particulate contamination associated therewith. In addition, the design simplicity advantageously reduces system cost and improves system reliability.

Figure 5:
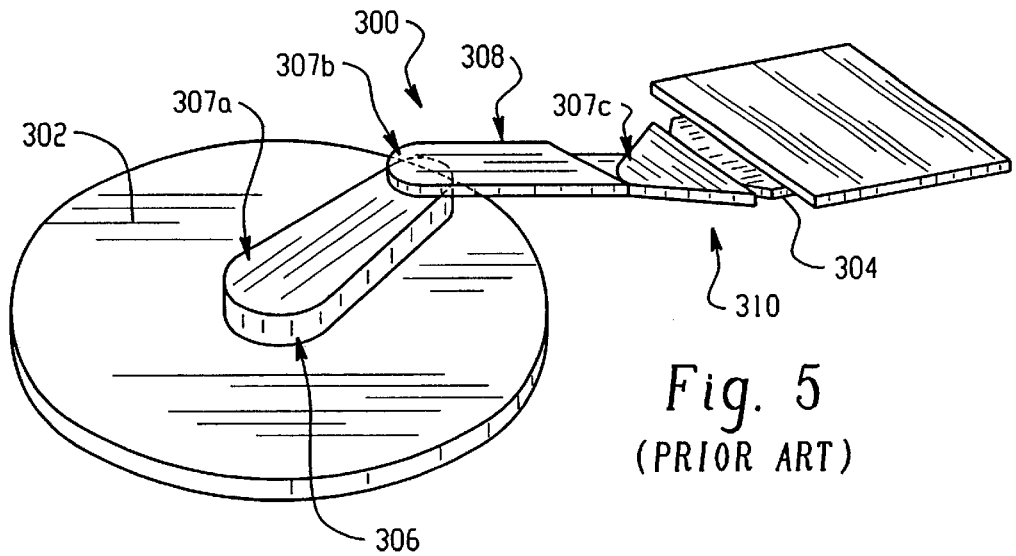
FIGS. 5 and 6 are perspective views illustrating a prior art multi-axis, multi-jointed articulated robot arm in extended and retracted positions, respectively.
Figure 6:
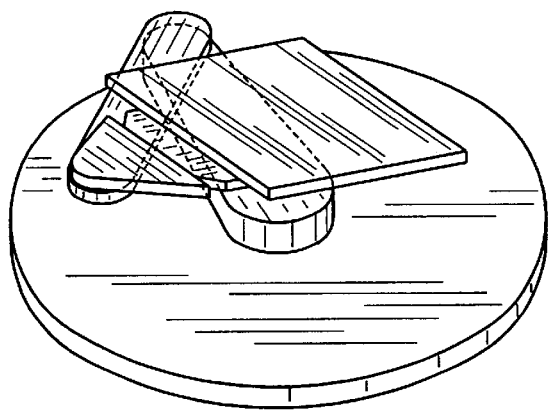
Figure 7A:
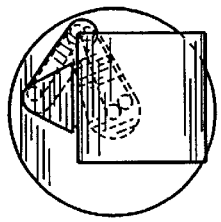
FIGS. 7a–7d are top plan views illustrating a plurality of positions of the prior art robot arm of FIGS. 5 and 6 depicting extended, retracted and intermediate positions, respectively.
Figure 7B:
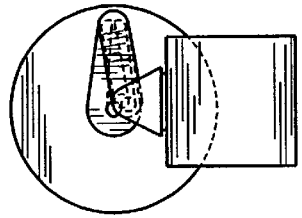
Figure 7C:
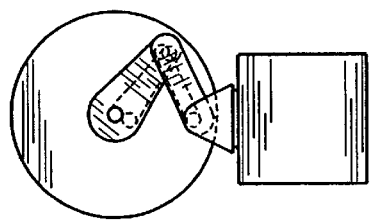
Figure 7D:
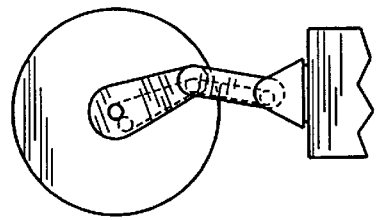

In order to best understand the various advantageous features of the present invention, a brief description of a prior art type wafer transfer apparatus is provided. FIGS. 5 and 6 illustrate perspective views of a multi-axis, multi-jointed articulated wafer transfer arm 300 which is capable of movement between an extended position (FIG. 5) and a retracted position (FIG. 6). In addition, FIGS. 7a–7d illustrate a sequence of successive movements between the extended and retracted positions, respectively. As illustrated in FIGS. 5 and 6, the transfer arm 300 can rotate about an axis on a platform 302 to move an end effector 304 for alignment with openings in the load lock chamber and process chambers, respectively.

The prior art transfer arm 300 includes an elongated base arm 306 which is rotatable in a level plane about a base axis 307a; a forearm 308 is rotatably coupled to the base arm 306 at an opposite end about a forearm axis 307b. The forearm 308 in turn is rotatably coupled to a wrist member 310 for rotation about a wrist axis 307c. As seen in FIGS. 5–7d, the prior art transfer arm 300 includes multiple arm members which rotate about a plurality of axes 307a–307c. Although such an arm 300 provides for compact movements, the plurality of joints and rotational arm members provide the potential for particulate contamination due to the frictional engagement of such arm members against one another and their movement about the multiple axes. In stark contrast, the wafer transfer system of the present invention substantially reduces particulate contamination, reduces cost and improves the system reliability over the prior art by utilizing one or more elongate transfer arms employing a single axis wafer movement between the load lock chamber 206 and the process chamber 202, respectively.

Figure 8A:
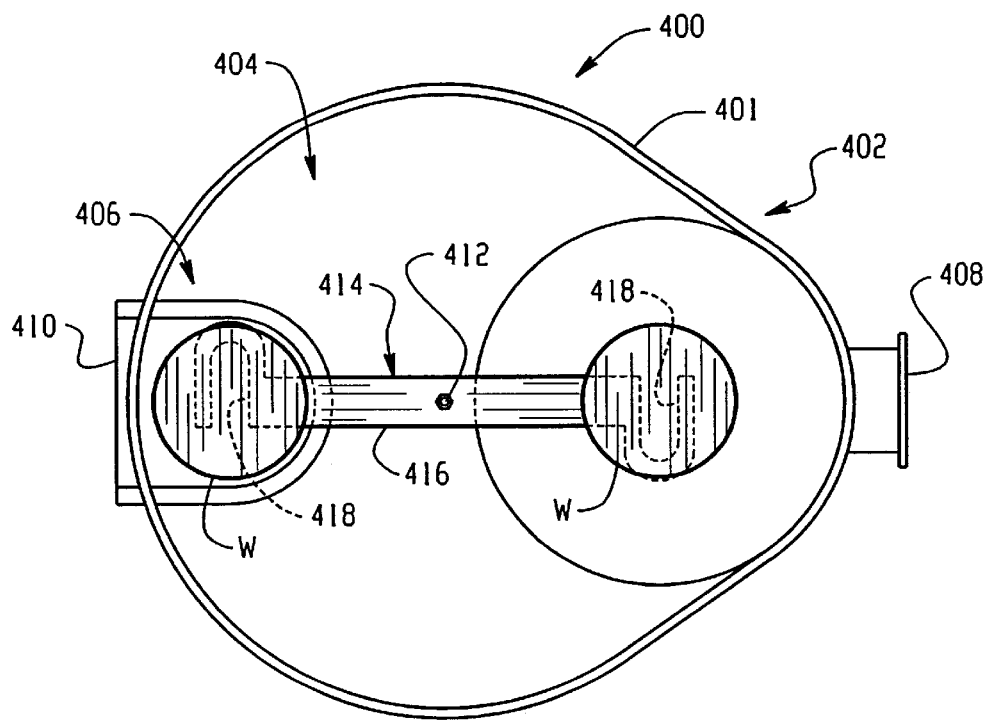
FIG. 8a is a top plan view of a wafer processing system employing a single axis wafer movement transfer arm in a transfer position according to the present invention.

FIG. 8a is a plan view of a wafer processing system 400, for example, a system similar to the system 200 of FIG. 3. The system 400 includes a system housing 401 which encompasses a process chamber 402, a transfer chamber 404, and a load lock chamber 406. The process chamber 402 includes a gas manifold 408 associated therewith for the introduction of process gases such as a dopant species in the case of a plasma immersion ion implantation system. In addition, the load lock chamber 406 includes an external access port 410 by which a wafer W may enter the system 400 from an external wafer cassette (not shown).

Preferably, within the transfer chamber 404 resides a wafer transfer axis 412 about which a single axis wafer movement transfer arm 414 rotates. The wafer transfer arm 414 includes an elongate transfer member 416 having generally U-shaped end effectors 418 at each distal end thereof. The transfer arm 414 rotates about the axis 412 at least 180° and may rotate a full 360°, as may be desired. In rotating 180°, the transfer arm 414 is operable to move between two substantially identical transfer positions (as illustrated in FIG. 8a), wherein each of the transfer positions correspond to an end effector 418 within the load lock chamber 406 and the process chamber 402, respectively. As will be discussed in greater detail below, the transfer positions correspond to method steps in which a wafer W is transferred to or from the process chamber 402 and the load lock chamber 406. In such an instance, the internal access port between the load lock chamber 406 and the transfer chamber 404 is open as well as the access port (e.g., the ring valve 210 of FIGS. 3–4b) between the transfer chamber 404 and the process chamber 402. Therefore in the instance illustrated in FIG. 8a, the load lock chamber 406 and the process chamber 402 are in fluid communication with one another via the transfer chamber 404.

Figure 8B:
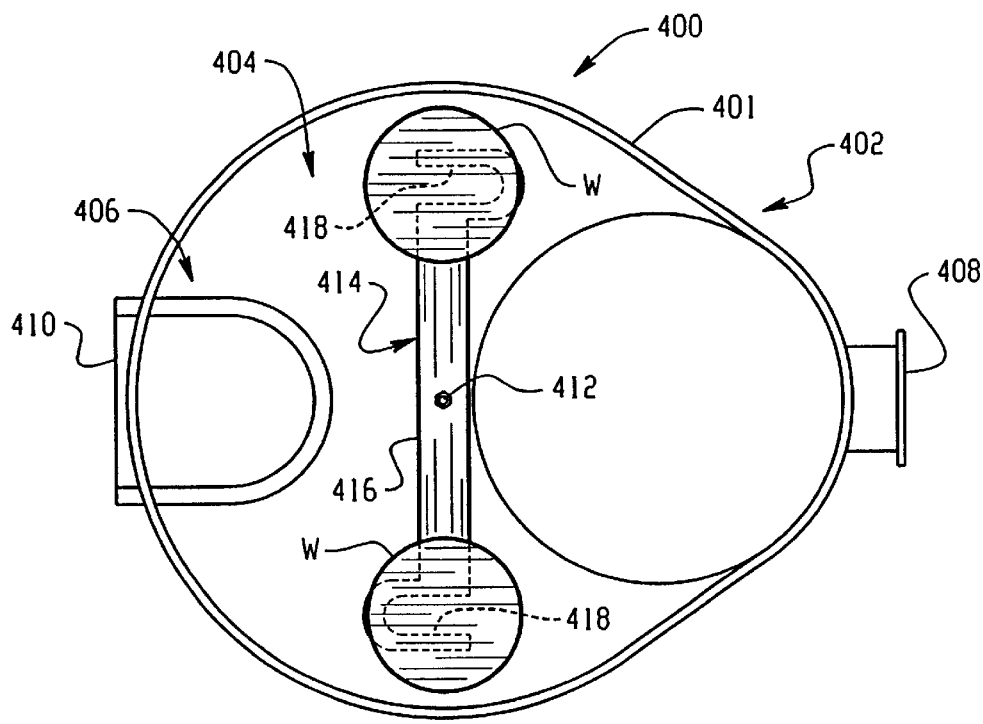
FIG. 8b is a top plan view of the wafer processing system of FIG. 8a illustrating the single axis wafer movement transfer arm in a neutral position according to the present invention.

The transfer arm 414 is also operable to rotate 90° into a neutral position, as illustrated in FIG. 8b, wherein the transfer arm 414 resides within the transfer chamber 404 entirely. In the neutral position, the internal access ports for the load lock chamber 406 and the process chamber 402 typically are closed, for example, wherein a wafer W is undergoing processing within the process chamber and another already processed wafer is being removed from the load lock chamber 406, replaced with an unprocessed wafer, and being pumped down to a processing environment pressure. Afterwards, when processing in the process chamber 402 is complete and the pump and vent cycle in the load lock chamber 406 is finished, the internal access ports of the respective chambers into the transfer chamber 404 are again opened and the transfer arm 414 may again rotate 90° into the transfer position, pick up the wafers in the chambers 402 and 406 via the end effectors 418, and rotate another 180° to switch the wafers therebetween.

Note that the transfer arm 414 of the present invention is substantially more simple than the multi-axis, multi-jointed articulated transfer arm 300 of the prior art (FIGS. 5–7d). Instead, the transfer arm 414 is a single, elongate member which provides single axis wafer movement during wafer transfer about the axis 412. Such single axis wafer movement reduces particulate contamination by avoiding multi-axis movements and the frictional engagement of multiple moving members inherent in such arrangements.

In the system 400 of FIGS. 8a and 8b, the housing 401 is generally circular to accommodate the generally circular transfer movements of the wafer transfer arm 414. According to an alternative embodiment of the present invention, for systems requiring a more compact housing footprint, a system 450 employing a generally elliptical system housing 452 is provided, as illustrated in FIGS. 9a–9d. In FIGS. 9a–9d, a wafer transfer arm 454 rotates about the axis 412. The transfer arm 454 differs slightly from the transfer arm 414 of FIGS. 8a and 8b in that the arm 454 contains end effectors 456 at each distal end that rotate about an end axis 458 in a controlled manner (i.e., as a function of the rotational position of the arm 454 about the center axis 412). In the above manner, the length or space footprint which the transfer arm occupies varies as the arm 454 rotates about the axis 412.

FIGS. 9a–9d illustrate the transfer arm 454 in four different rotational positions to illustrate an exemplary manner in which the transfer system 450 provides a reduced housing footprint. The system 450 further includes a controller (not shown) which controls the rotation of the end effectors 456 about their respective end axes 458.

Figure 9A:
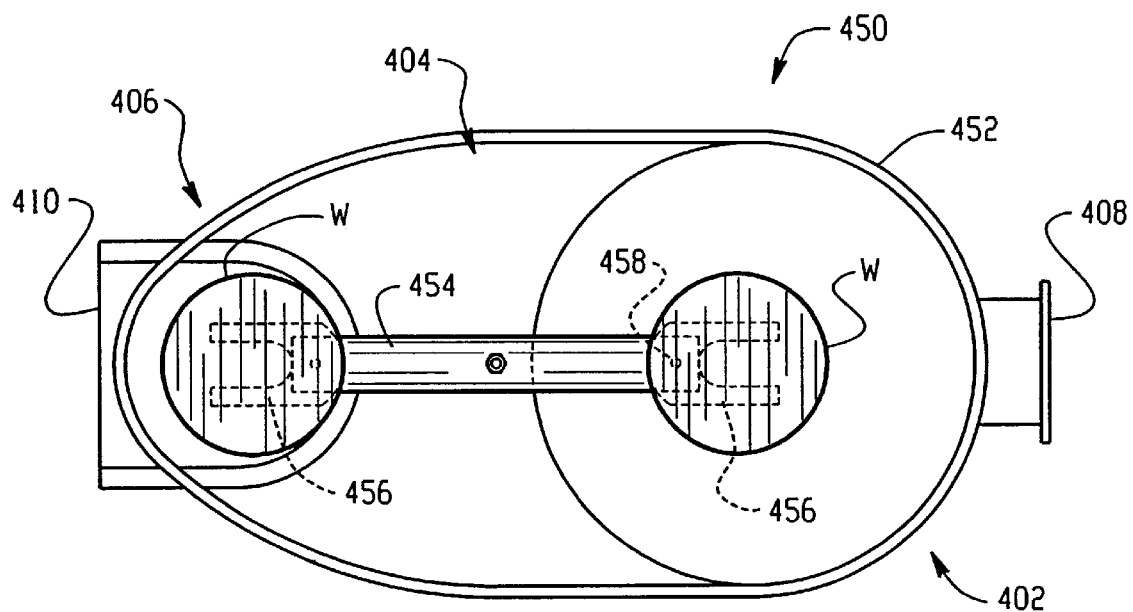
FIGS. 9a–9d are top plan views of a wafer processing system employing a wafer transfer arm which traverses a generally elliptical wafer transfer path in a number of different wafer transfer positions according to the present invention.
Figure 9B:
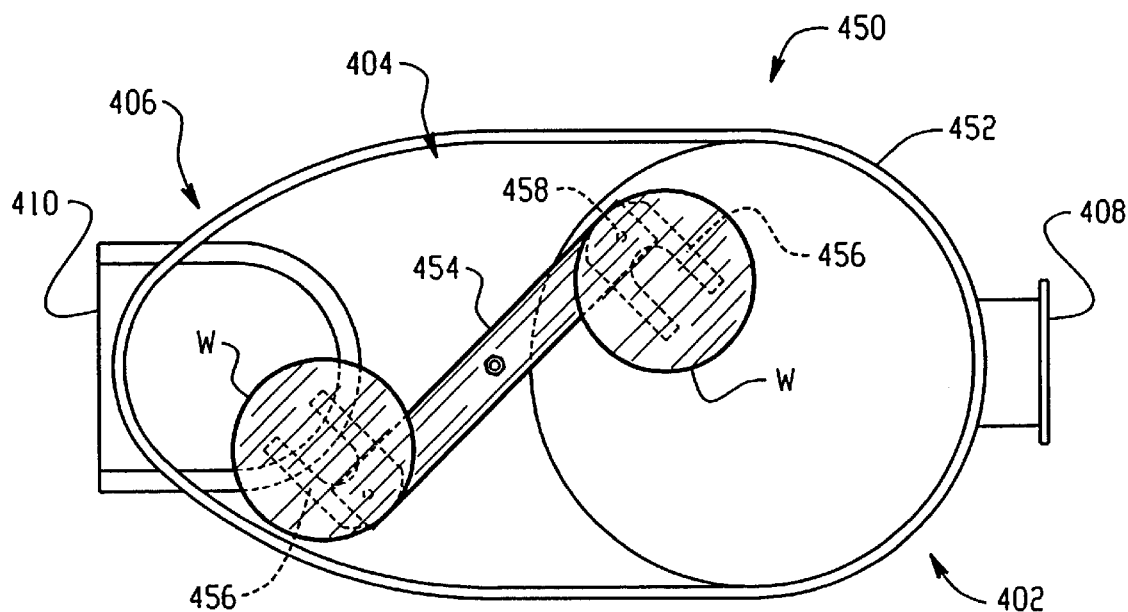
Figure 9C:
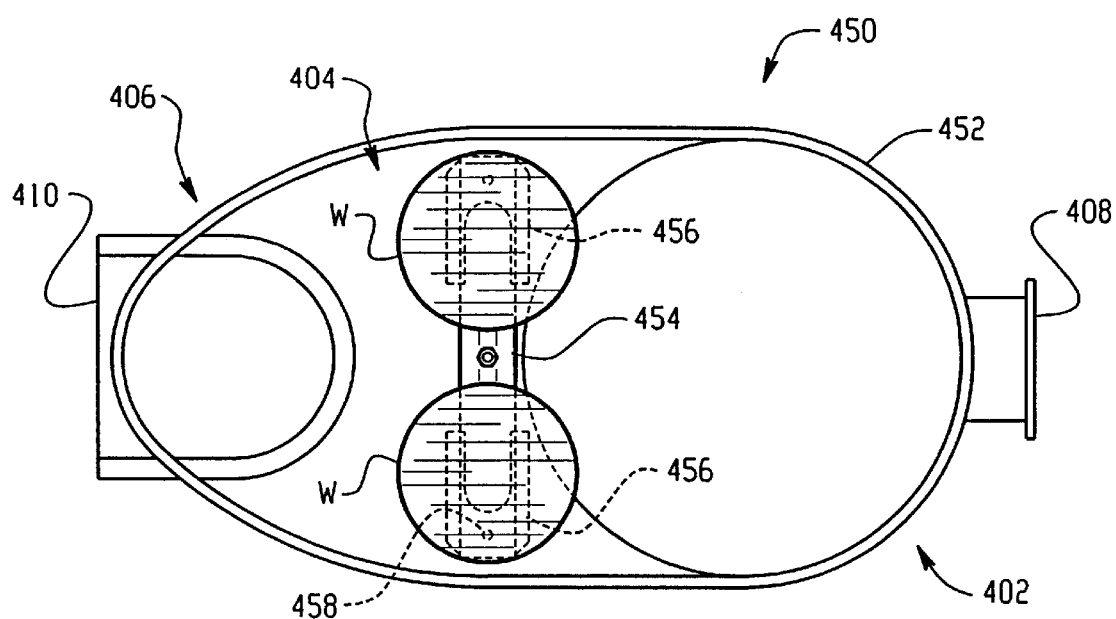
Figure 9D:
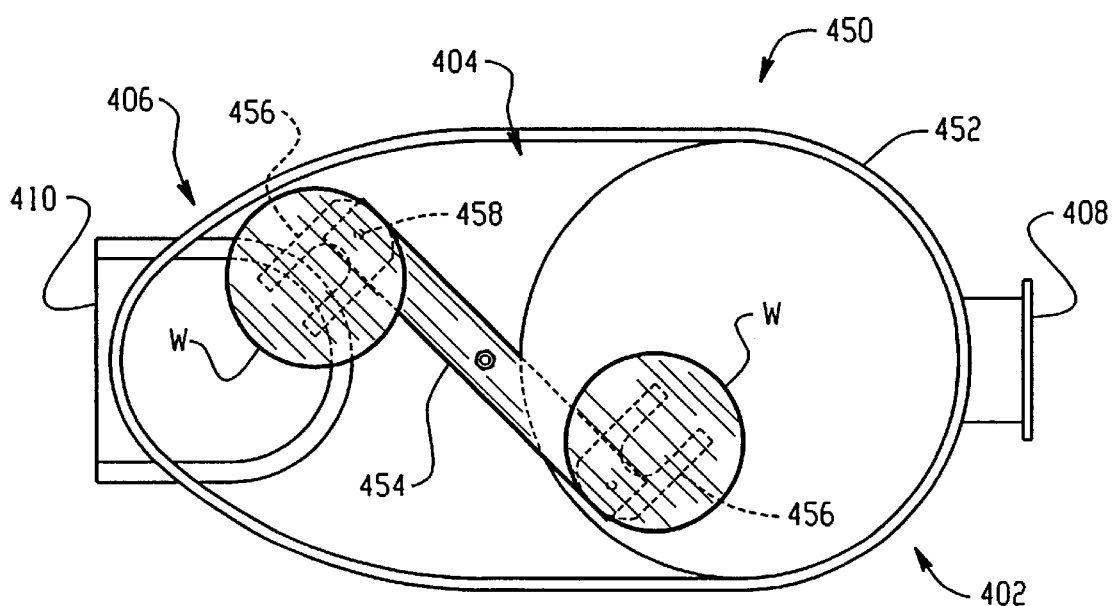

Preferably, the controller senses a rotational position of the base transfer arm 454 about the center axis 412 and uses the sensed rotational position to control the rotation of the end effectors 456 about their end axes 458. As illustrated in FIG. 9a, when the transfer arm 454 is in a generally horizontal orientation, the end effectors 456 are rotated to their extended orientations, while in FIG. 4c, when the transfer arm 454 is in a generally vertical orientation, the end effectors 456 are rotated to their retracted orientations. Therefore, as illustrated in FIGS. 9a–9d, the end effectors 456 (and therefore the wafers W) travel between the chambers 402 and 406 in a generally elliptical transfer path.

The wafer transfer arm of FIGS. 8a–9d illustrate wafer transfers between the process chamber 402 and a single load lock chamber 406. According to another embodiment of the present invention, the wafer transfer system may be employed with multiple load lock chambers (preferably two such chambers) in order to further improve processing throughput over prior art systems. In some processing operations, the processing cycle time is less than the pump and vent cycle time associated with establishing a process environment pressure within the load lock chamber. In such an instance, although the processing of a wafer in the process chamber is complete, the system must wait for the load lock pressure to equalize the process chamber pressure, resulting in dead time in the process chamber where no wafer processing is occurring. According to the alternative embodiment of the present invention, the process chamber maximizes its processing efficiency by maintaining processing of wafers therein substantially constantly, with processing discontinuing only for the time necessary to swap the processed wafer with a new, unprocessed wafer. Using the multiple load lock chambers generally in parallel with one another allows one load lock chamber to pump and vent while the other load lock chamber is swapping wafers with the process chamber. Consequently, as soon as processing is completed, a load lock chamber is ready to "swap in" a new unprocessed wafer.

Figure 10A:
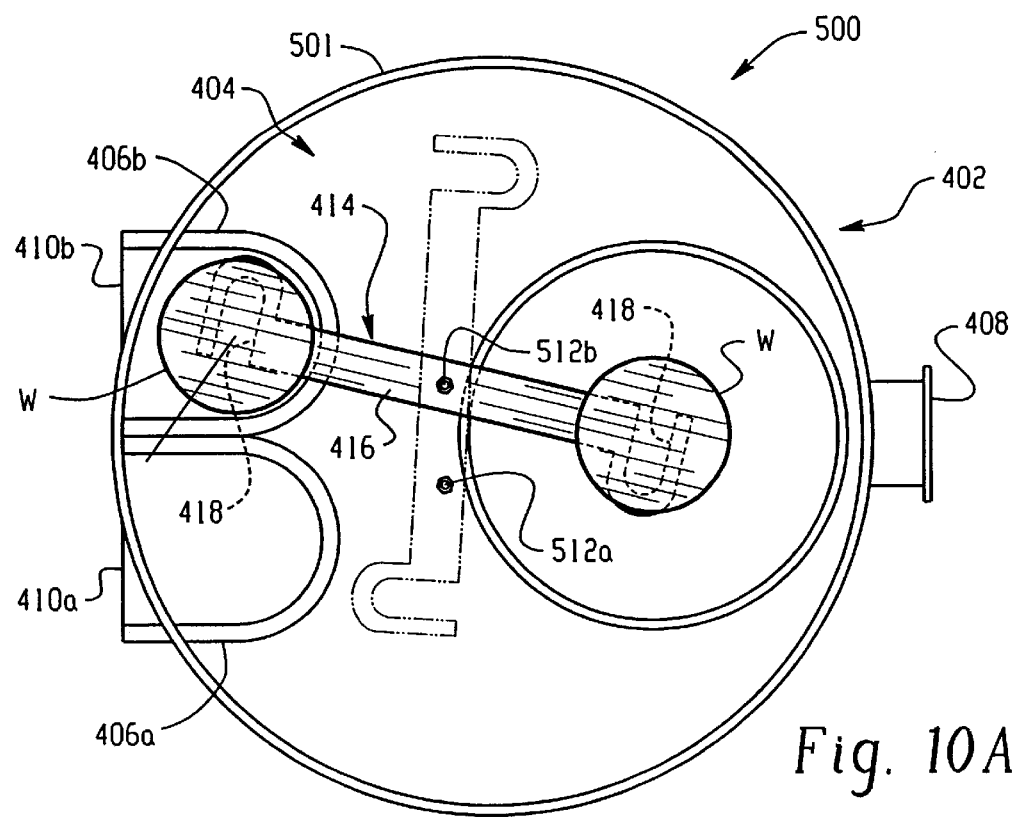
FIG. 10a is a top plan view of a wafer processing system employing multiple load lock chambers and two single axis wafer movement transfer arms, one being in a transfer position and the other in a neutral position according to the present invention.
Figure 10B:
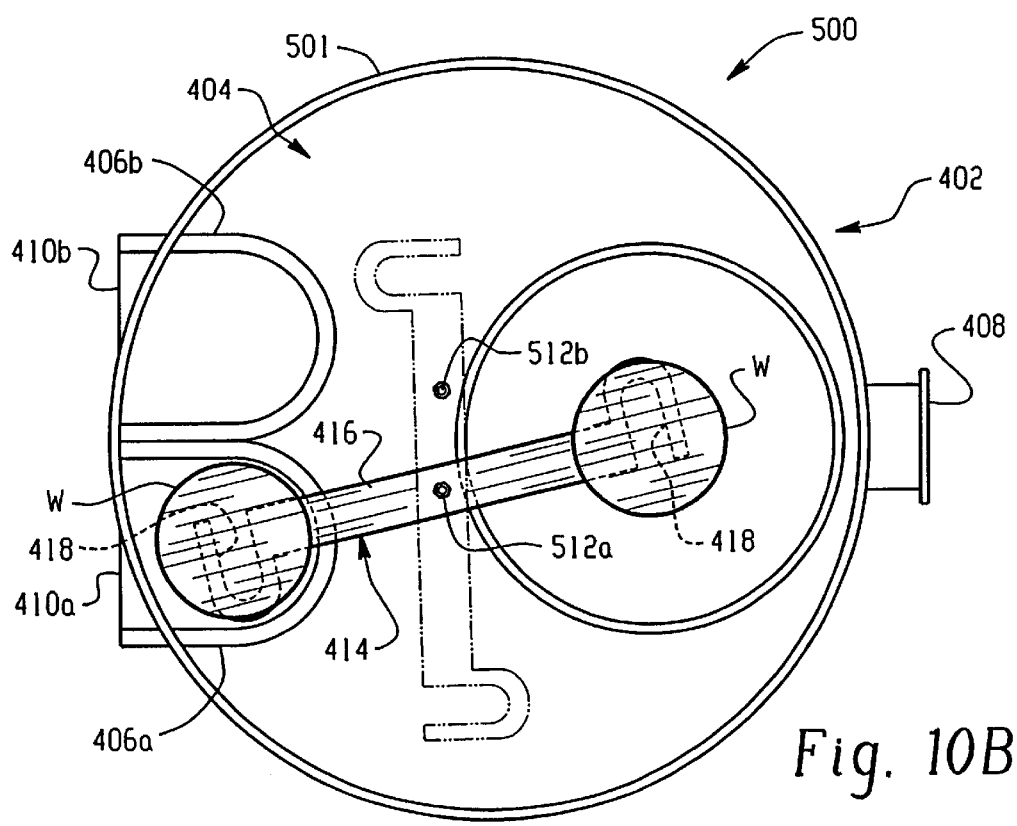
FIG. 10b is a top plan view of the wafer processing system of FIG. 10a illustrating the single axis wafer movement transfer arms of FIG. 10a in different positions according to the present invention.
Figure 11A:
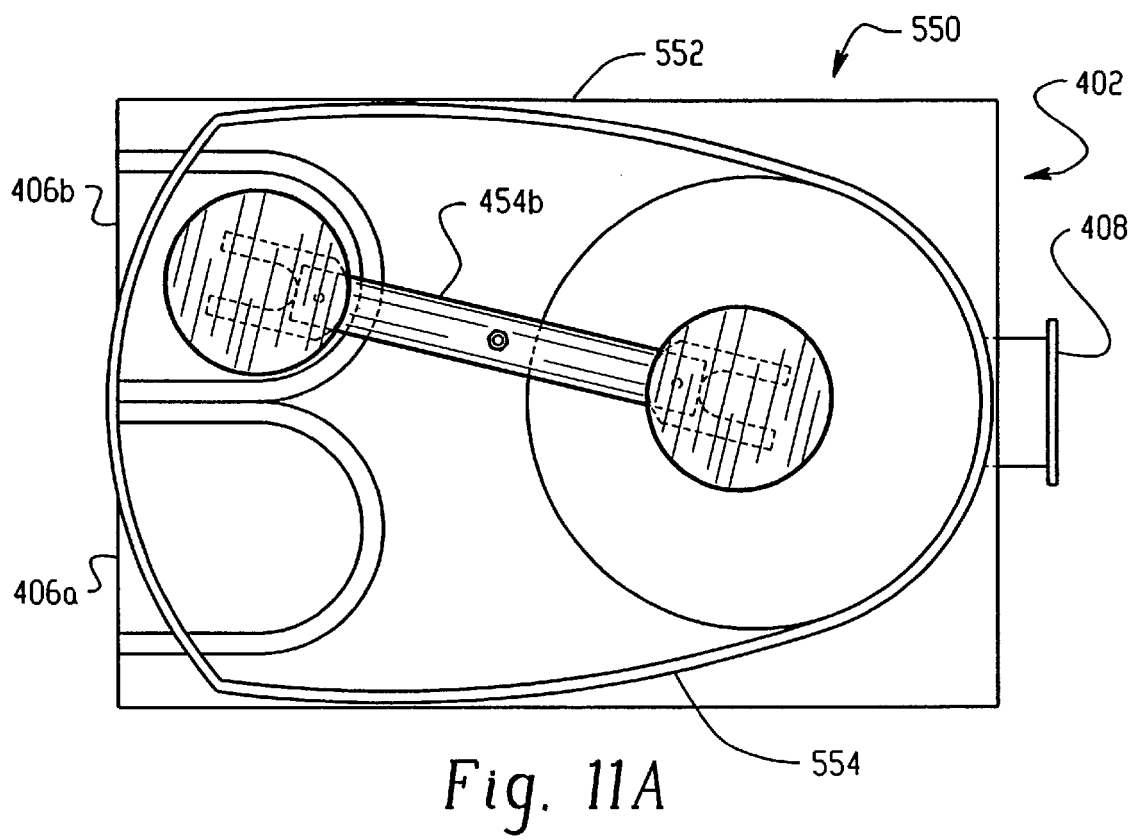
FIGS. 11a–11d are top plan views of a wafer processing system having two load lock chambers and employing two wafer transfer arms which traverse generally elliptical wafer transfer paths in a number of different wafer transfer positions according to the present invention.
Figure 11B:
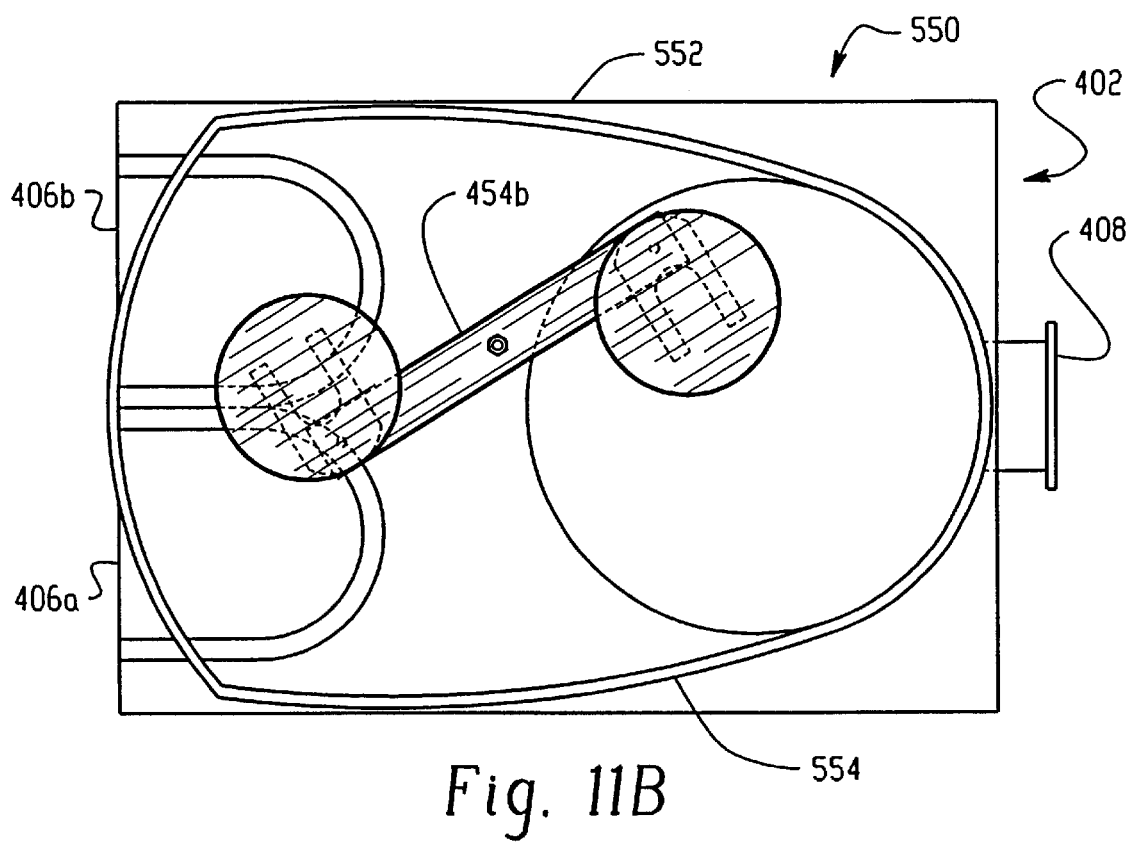
Figure 11C:
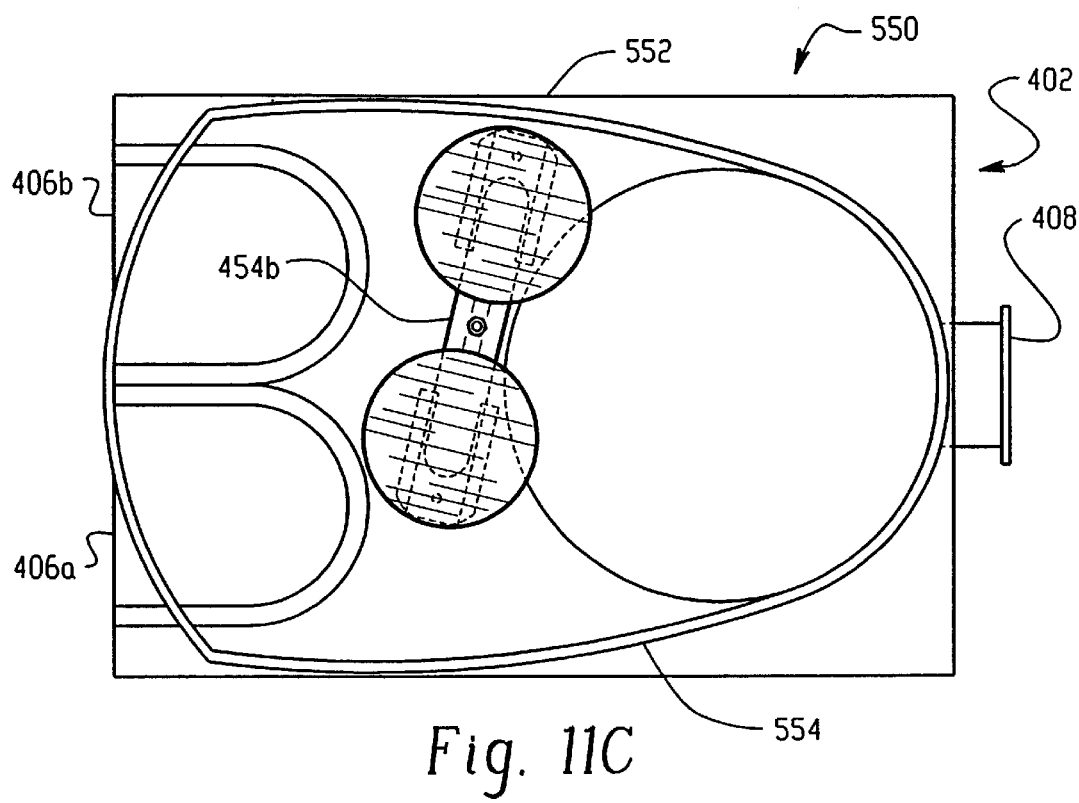
Figure 11D:
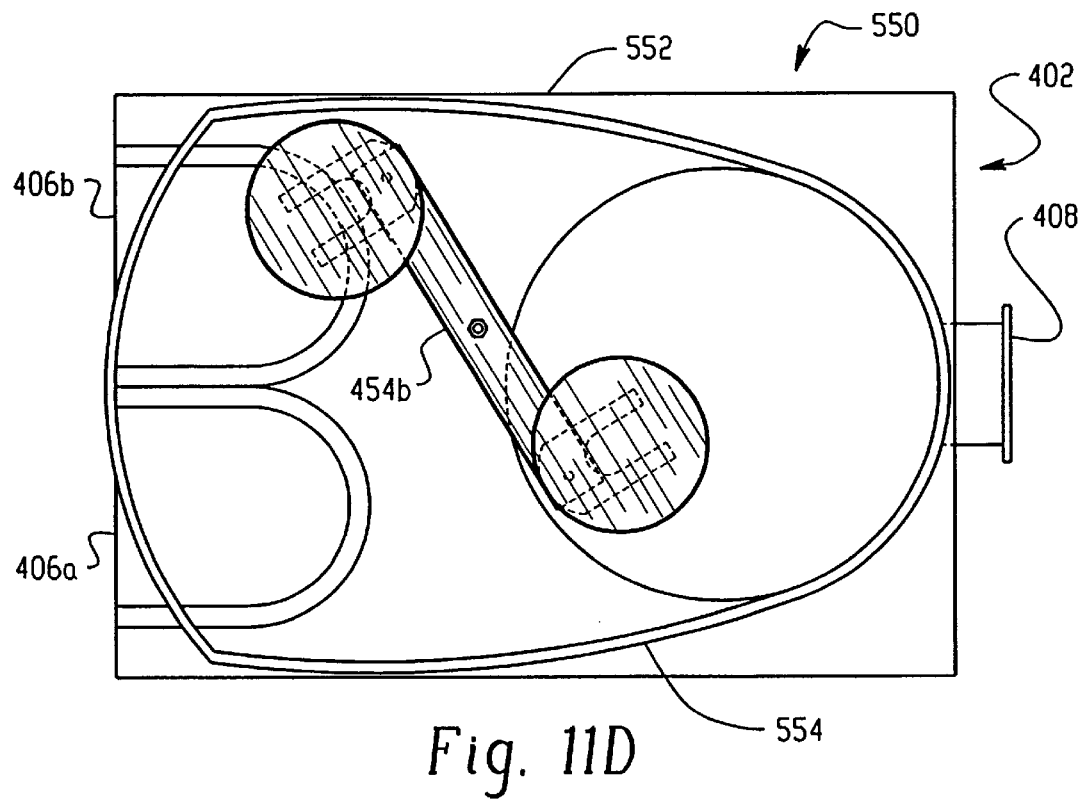

An exemplary system for effectuating the above functionality is shown in FIGS. 10a and 10b, designated at reference numeral 500. The system 500 includes a system housing 501 which incorporates the process chamber 402 and the transfer chamber 404 in a manner similar to FIGS. 8a and 8b. The system 500 further includes two load lock chambers 406a and 406b having external access ports 410a and 410b associated therewith. The load lock chambers 406a and 406b are operable to pump and vent a wafer therein down to a process environment temperature and wafers are transferred to and from the process chamber 402 via two single axis wafer movement transfer arms 414 which couple to and rotate about separate axes 512a and 512b within the transfer chamber 404. As illustrated in FIG. 10a, when one transfer arm 512b resides in a transfer position (i.e., swapping wafers between chambers 406b and 402), the other transfer arm 512a (illustrated in phantom for clarity) resides in a neutral position, thereby allowing the other load lock chamber 406a to pump down to the process environment pressure.

Both transfer arms 512a and 512b of FIGS. 10a and 10b preferably swap wafers W between their respective load lock chamber and the process chamber 402 within a wafer transfer plane. In order to avoid the transfer arms 512a and 512b from interfering with each other, each arm 414 is positioned generally within the wafer transfer plane, however, each is positioned at a slightly different vertical position, as may be appreciated.

FIGS. 10a and 10b illustrate a system housing 501 which is generally circular in shape to accommodate the generally circular transfer paths of the transfer arms 414 about their respective axes 512a and 512b. Alternatively, if a smaller system housing footprint is needed or desired, a system as illustrated in FIGS. 11a–11d, designated generally at reference numeral 550, is provided. The system 550 has a generally rectangular system housing 552 including a generally oblong transfer chamber 554, the process chamber 402 and two load lock chambers 406a and 406b, respectively. The system 550 operates generally under the operational principles discussed above in conjunction with FIGS. 9a–9d and FIGS. 10a and 10b. That is, two transfer arms 560a and 560b within the transfer chamber 554 operate in conjunction with one another to maximize the utilization efficiency of the processing chamber. In addition, each transfer arm 454a and 454b are similar to the transfer arm 454 of FIGS. 9a–9d and thus traverse a generally elliptical transfer path.

Figure 12:
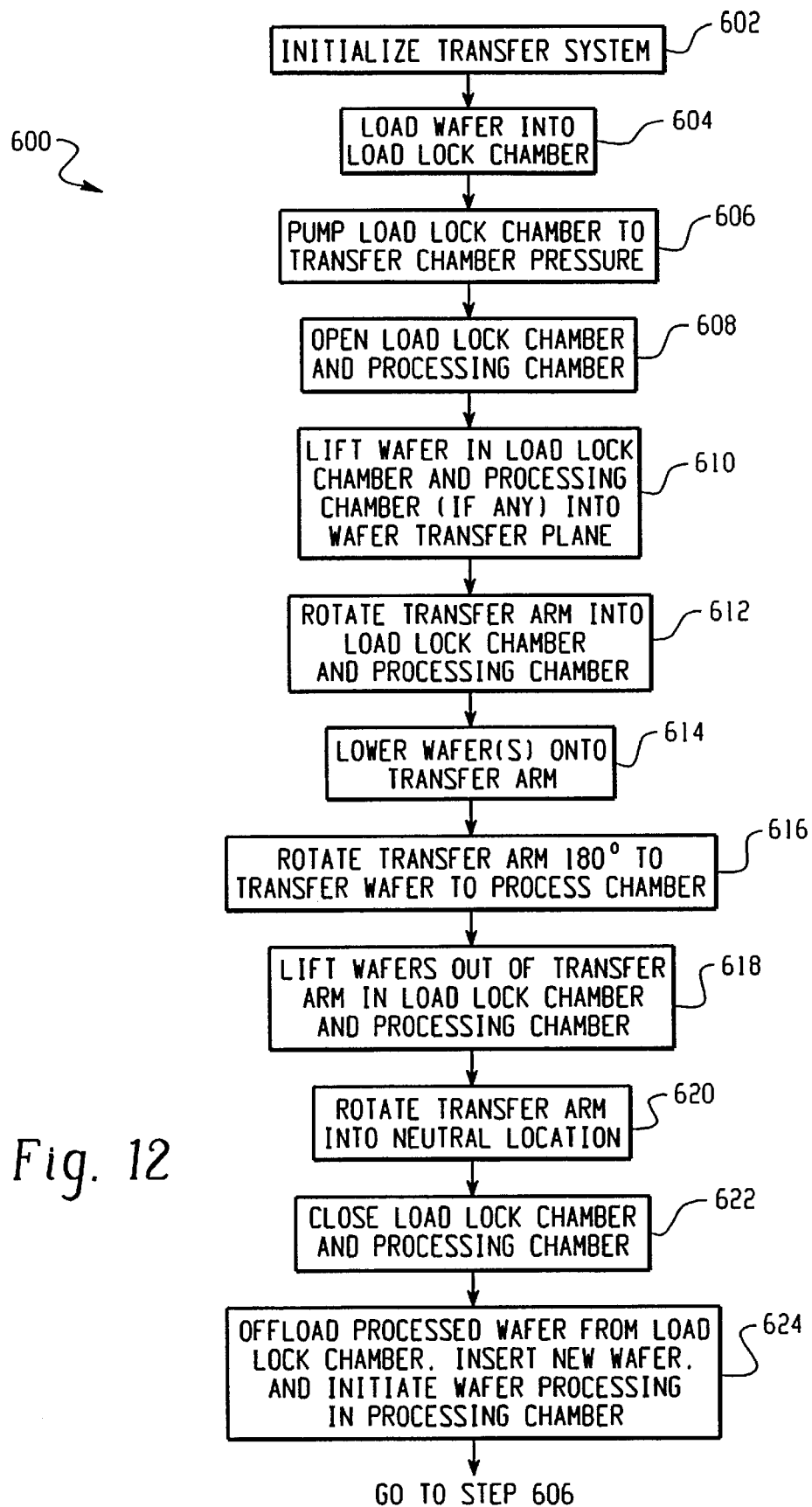
FIG. 12 is a flow chart diagram illustrating a methodology for transferring wafers to and from a process chamber without a process chamber pump and vent cycle for each wafer transfer according to the present invention.

The systems 400, 450 of FIGS. 3 and 8a–9d may be utilized in accordance with a method of serially transferring wafers to and from a process chamber. One exemplary method is illustrated in FIG. 12 and designated at reference numeral 600. The method begins at step 602 with a system initialization, wherein the transfer arm 414 is rotated into the neutral position, the load lock cover 250 associated with the load lock chamber 206, 406 is actuated into a closed position and the ring valve 210 associated with the process chamber 202, 402 is closed. A wafer W is then loaded into the recess portion 252 via the access port 262, 410 of the load lock chamber 206, 406 at step 604 and the recess portion 252 is then pumped or otherwise evacuated to equalize the pressure between the recess portion 252 of the load lock chamber 206, 406 and the transfer chamber 204, 404/process chamber 202, 402 at step 606.

Once the pressure equalization has been obtained, the load lock cover 250 is lifted via the actuator 254 and the ring valve 210 is moved to an open or retracted position 212 via the actuator 220 at step 608, thereby bringing the recess portion 252 of the load lock chamber 206, 406 into fluid communication with the process chamber 202, 402. The wafer W within the load lock chamber 206, 406 is then lifted into the wafer transfer plane 260 via the pin assembly 256 at step 610 and the transfer arm 414 is rotated from the neutral position of FIG. 8b into the transfer position of FIG. 8a at step 612. The wafer W is then lowered onto the end effector 418 of the transfer arm 414 at step 614 via the pin assembly 256 and the transfer arm 414 is rotated 180° to thereby transfer the wafer W from the load lock chamber 206, 406 to the process chamber 202, 402 in an efficient, single axis wafer movement at step 616.

The method 600 of FIG. 12 continues at step 618 where the pin assembly within the process chamber 202, 402 lifts the wafer W off of the transfer arm 414. The transfer arm 414 then rotates 90° into the neutral position as illustrated in FIG. 8b at step 620, followed by closing the load lock cover 250 and the ring valve 210 at step 622, wherein wafer processing and the transfer of another unprocessed wafer into the load lock chamber recess 252 is initiated at step 624. The method 600 then returns to step 606 and the recess portion 252 of the load lock chamber 206, 406 is pumped down to the process environment pressure and the various method steps are repeated. In this next case, a wafer resides in both the load lock chamber 206, 406 and the process chamber 202, 402. Thus at step 610, both wafers are lifted into the wafer transfer plane and both wafers are lowered onto respective ends of the transfer arm at step 614. Lastly, step 618 will include the off-loading of both wafers.

The method 600 of FIG. 12 advantageously reduces particulate contamination and increases throughput over prior art systems by maintaining the process chamber at the process environment pressure throughout the load process 600. Thus the process chamber 202, 402 avoids a pump and vent cycle each time a wafer is transferred thereto. Although the method 600 provides several advantages over prior art systems, process throughput may be further improved using multiple load lock chambers such as those illustrated in FIGS. 10a–11d. A method 700 of transferring and processing wafers in a processing system is illustrated in FIGS. 13a–13c.

Figure 13A:
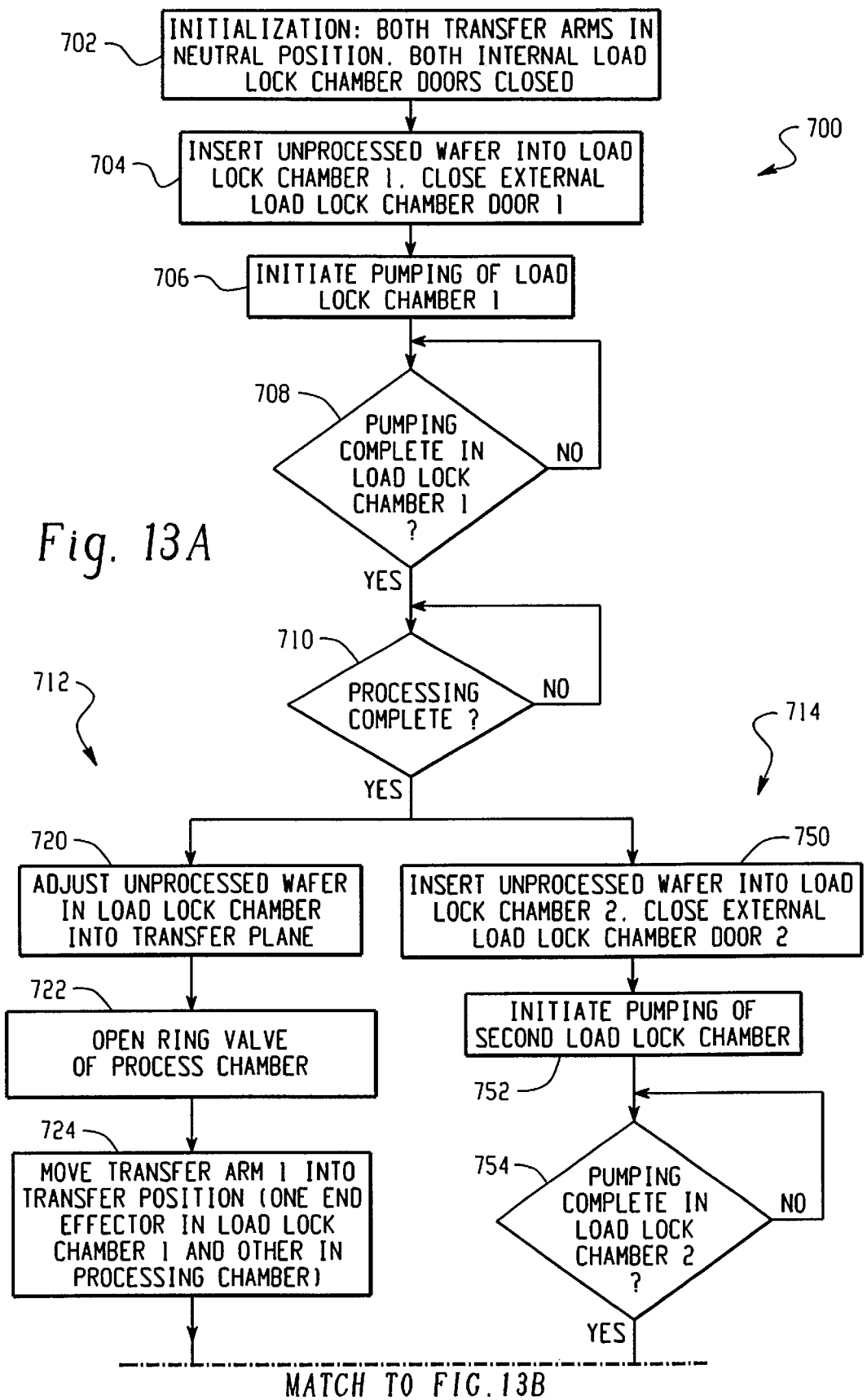
FIGS. 13a–13c are flow chart diagrams illustrating another methodology for transferring wafers to and from a process chamber via multiple load lock chambers without a process chamber pump and vent cycle for each wafer transfer according to the present invention.
Figure 13B:
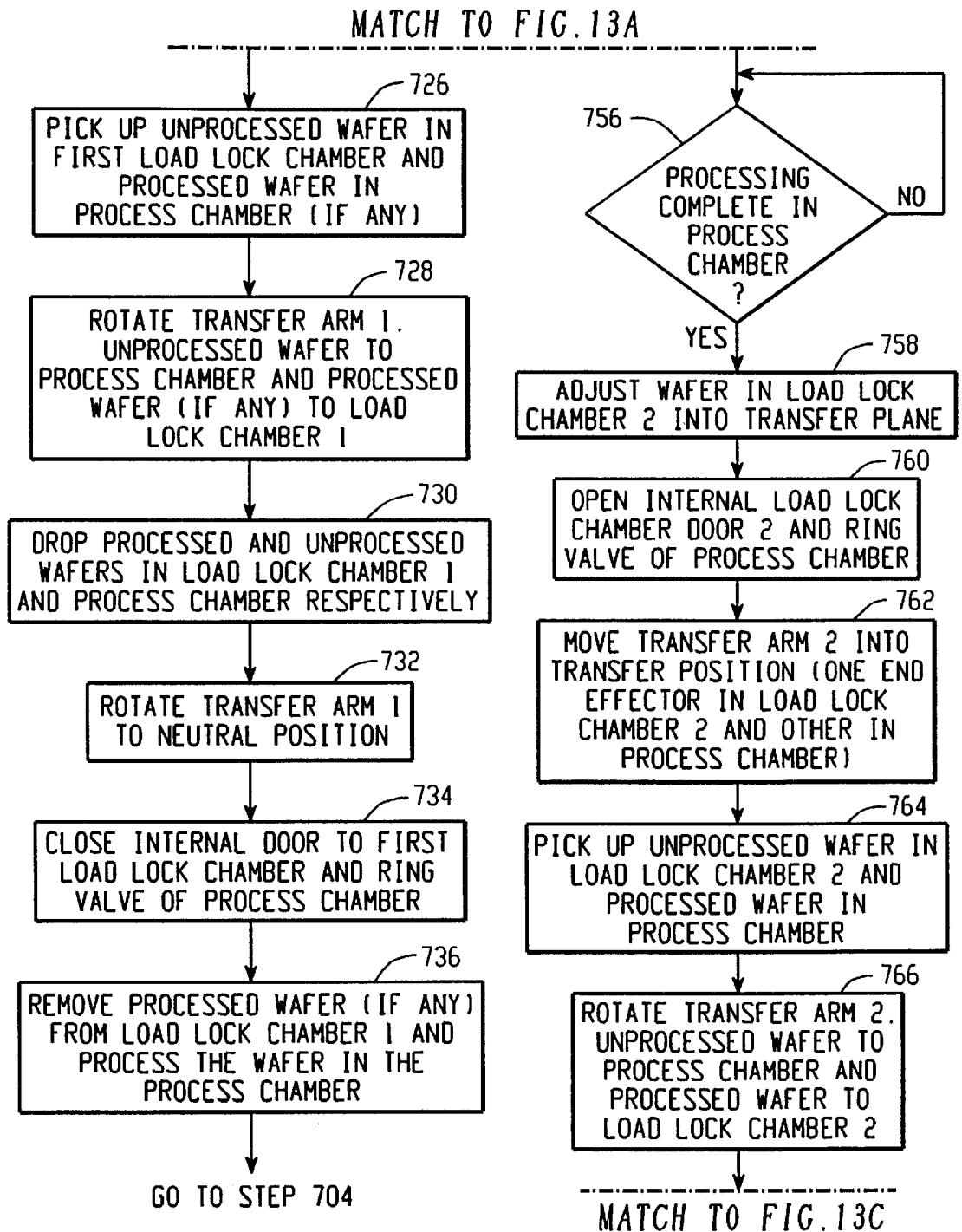
Figure 13C:
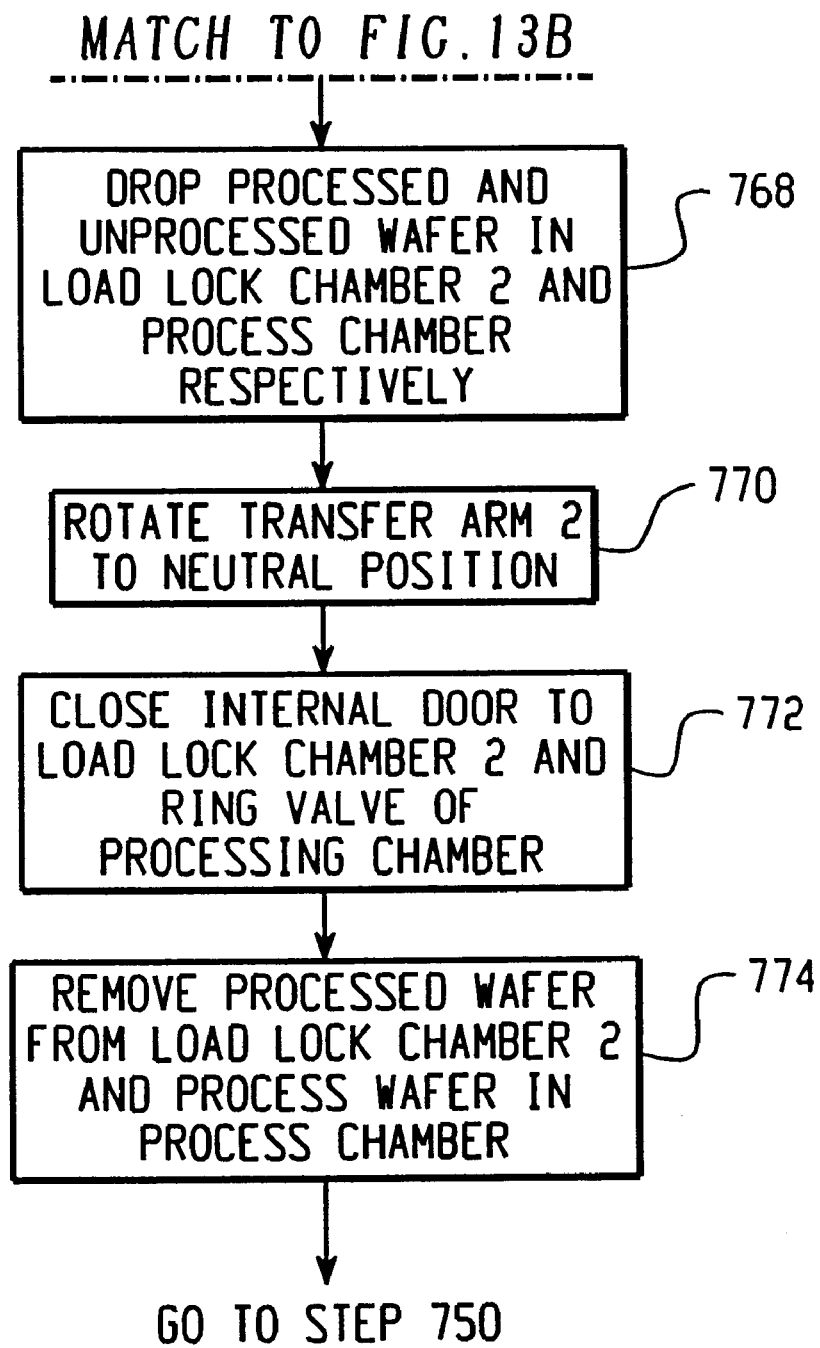

At step 702 of FIG. 13a the system 500, 550 is initialized; that is both transfer arms 414 are in neutral positions, both load lock covers 250 are closed and the ring valve 210 is closed. Thus the recess regions 252 within the load lock chambers 406a and 406b are fluidly isolated from the rest of the system. An unprocessed wafer W is then inserted into one of the load lock chambers 410a via an external access port at step 704 and the recess portion 252 of the load lock chamber 410a is then pumped down to the process chamber pressure at step 706. Once pumping is complete at step 708 and processing is complete at 710 (not presently relevant because no wafer is in the process chamber 202, 402 at this time), two different sets of steps 712 and 714 begin to occur in parallel because two load lock chambers exist.

Step set 712 includes the step of moving the unprocessed wafer W within the load lock chamber 410a into the wafer transfer plane 260 by lifting the load lock cover 250 and actuating the pin assembly 256 via the actuator 258 at step 720. The ring valve 210 is then opened at step 722 and the transfer arm 414 associated with the first axis 512a moves the wafer W from the load lock chamber 410a to the process chamber 202, 402 at steps 724, 726 and 728 (see FIGS. 13a and 13b). Note that initially no wafer is in the process chamber 202, 402, however, subsequently, the wafer transfer of steps 724–728 will include two wafers (ie., a wafer swap).

The wafer W is deposited in the process chamber 202, 402 (and later in both chambers) via the pin assembly therein at step 730. The transfer arm 414 associated with the axis 512a is then rotated into the neutral position at step 732. Once in the neutral position, the transfer arm 414 associated with the axis 512a will not interfere with the load lock chamber 406a. The load lock cover 250 for the load lock chamber 406a and the ring valve 210 of the process chamber 202, 402 are then closed at step 734. At this time no processed wafer was swapped so no wafer removal occurs at the first load lock chamber 406a at step 736, however, later in the process 700 such a swap will occur.

In parallel with the step set 712 is another set of steps 714 associated with the second load lock chamber 406b. While the first load lock chamber 406a is swapping its wafer with the process chamber 202, 402, another unprocessed wafer W is inserted into the second load lock chamber 406b via the external access port 410b at step 750. The external port 410b is closed and the chamber 406b is then pumped down at step 752. Once the pumping is complete at step 754 and the processing is complete at step 756 (corresponding to the wafer transferred initially from the first load lock chamber 406a), the wafer W in the second load lock chamber 406b is moved into the wafer transfer plane 280 at step 758 (FIG. 13c) when the cover 250 is lifted via the actuator 254 at step 760 and the transfer arm 414 associated with second axis 512b swaps the unprocessed wafer from the second load lock chamber 406b with the processed wafer via steps 762–768. The transfer arm 414 associated with the second axis 512b is then moved to the neutral position at step 770, the doors close at step 772 and processing commences.

Note that although the first unprocessed wafer W entered the process chamber 202, 402 via the first load lock chamber 406a and the transfer arm 414 associated with the first axis 512a, the wafer, upon being processed, exits the process chamber 202, 402 and gets transferred to the second load lock chamber 406b via the transfer arm 414 associated with the second axis 512b. Therefore according to the exemplary method 700 of the present invention, wafers enter and exit from different load lock chambers. Thus, once the ring valve 210 is closed at step 772 of FIG. 13c, the unprocessed wafer W from the second load lock chamber 406b will be processed and the processed wafer will be removed from the second load lock chamber at step 774. The method 700 then continues at step 750.

As can be seen from the above, the method 700 of the present invention enhances the utilization efficiency of the process chamber 202, 402 by immediately swapping a new unprocessed wafer therein as soon as wafer processing is complete. Because both load lock chambers 406a, 406b work generally in parallel, while one is swapping wafers with the process chamber 202, 402 the other is getting a new unprocessed wafer and initiating a pump and vent cycle without impacting the process environment in the process chamber.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. A wafer processing apparatus, comprising:

a processing chamber having a top chamber portion and a bottom chamber portion, respectively; and an annular ring valve associated with one of the top chamber portion and the bottom chamber portion, the ring valve operable to open the processing chamber for access thereto in a first position, and close the processing chamber for processing in a second position, wherein the ring valve in the second position provides a substantially uniform surface about an inner periphery of the closed processing chamber, thereby facilitating uniformity in processing conditions therein.

2. The wafer processing apparatus of claim 1, wherein the ring valve in the second position extends from the one of the top chamber portion and the bottom chamber portion associated therewith and abuts the other of the top chamber portion and the bottom chamber portion, thereby coupling the top and bottom chamber portions together and substantially sealing the processing chamber from external conditions.

3. The wafer processing apparatus of claim 1, wherein the ring valve in the first position is retracted with respect to the other of the top chamber portion and the bottom chamber portion, thereby decoupling at least a portion of the top and bottom chamber portions corresponding to an access port for transfer or retrieval of a wafer to or from the processing chamber, respectively.

4. The wafer processing apparatus of claim 1, further comprising an actuation member operatively coupled to the ring valve, wherein the actuation member is operable to selectively position the ring valve in the first and second positions, respectively.

5. The wafer processing apparatus of claim 1, wherein the ring valve comprises a material which is substantially the same as a top and bottom chamber portion material, thereby providing a substantially uniform interior surface about the processing chamber over variations in interior chamber processing conditions.

6. The wafer processing apparatus of claim 1, wherein the processing chamber includes an access port and the wafer processing apparatus further comprises:

a transfer chamber operatively coupled to the processing chamber via the access port; and a load lock chamber operatively coupled to the transfer chamber, the load lock chamber including a load lock cover operable to move between two positions, wherein a first position isolates a portion of the load lock chamber from the transfer chamber, thereby allowing a pressure in the portion of the load lock chamber to differ from a pressure in the transfer chamber during a wafer transfer from an ambient pressure environment external the load lock chamber to the isolated portion of the load lock chamber, and wherein a second position of the load lock cover brings the portion of the load lock chamber into fluid communication with the transfer chamber for transfer of a wafer between the load lock chamber and the processing chamber.

7. The wafer processing apparatus of claim 6, further comprising a pump associated with the portion of the load lock chamber, wherein the pump is operable to reduce a pressure within the portion of the load lock chamber when the load lock cover is in the first position, thereby substantially matching a pressure in the portion of the load lock chamber with a pressure in the transfer chamber and the processing chamber.

8. The wafer processing apparatus of claim 1, wherein the processing chamber comprises an ion implantation processing chamber.

9. The wafer processing apparatus of claim 8, wherein the processing chamber comprises a plasma immersion ion implantation processing chamber.

10. A wafer processing apparatus, comprising:

a processing chamber having an access port for transferring a wafer thereto or retrieving a wafer therefrom; and a ring valve within the processing chamber, the ring valve operable to move between two positions, wherein the ring valve in the first position opens the access port for access to the processing chamber, and the ring valve in the second position closes the access port.

11. The wafer processing apparatus of claim 10, wherein the ring valve has an annular shape with a substantially uniform inner peripheral surface.

12. The wafer processing apparatus of claim 11, wherein the ring valve in the second position is positioned within the processing chamber to sealingly engage and thereby close the access port to prevent contamination of a wafer chamber processing environment, and wherein the annular ring valve provides a substantially uniform inner peripheral surface for the processing chamber thereat, thereby facilitating uniform processing conditions therein.

13. The wafer processing apparatus of claim 10, wherein a composition of the ring valve and the processing chamber is substantially the same.

14. The wafer processing apparatus of claim 10, wherein the processing chamber further comprises a top interior portion and a bottom interior portion annularly separated, thereby defining an annular spacing therebetween, and wherein the access port interfaces with a portion of the annular spacing to allow access to the processing chamber, and wherein the ring valve in the second position occupies the annular spacing, thereby coupling the top and bottom portions together by sealingly engaging the top and bottom portions, respectively.

15. The wafer processing apparatus of claim 14, wherein the bottom interior portion of the processing chamber includes an annular lip about an inner periphery thereof, and wherein the ring valve engages the annular lip in the first position.

16. The wafer processing apparatus of claim 10, further comprising an actuator operatively coupled to the ring valve, and operable to move the ring valve between the first and second positions, respectively.

17. The wafer processing apparatus of claim 16, wherein the actuator comprises one or more gear and screw assemblies, wherein the gear turns the screw which engages a bottom portion of the ring valve, and a turning of the screw adjusts a vertical position of the ring valve within the processing chamber.

18. The wafer processing apparatus of claim 10, further comprising:
   a transfer chamber coupled to the processing chamber via the access port; and
   a load lock chamber coupled to the transfer chamber, the load lock chamber including:
      an access port for receiving a wafer into the load lock chamber; and
      a selectively positionable isolation member within the load lock chamber, positionable between an isolation position and a non-isolation position, wherein in the isolation position the isolation member sealingly engages a portion of the load lock chamber associated with the load lock chamber access port, thereby permitting the transfer of a wafer to or from the load lock chamber via the load lock chamber access port without impacting processing conditions within the transfer chamber and the processing chamber, and
      wherein when the isolation member is in the non-isolation position the portion of the load lock chamber is in fluid communication with the transfer chamber.

19. The wafer processing apparatus of claim 18, further comprising an actuator operatively coupled to the isolation member, wherein the actuator is operable to selectively position the isolation member in the isolation position and the non-isolation position, respectively.

20. A method of accessing a wafer processing apparatus, comprising the steps of moving an annular ring valve within a processing chamber from a first position where the annular ring valve does not block access to an access port of the processing chamber, thereby permitting access thereto, to a second position where the annular ring valve sealingly blocks the access port, thereby prohibiting access to the processing chamber, wherein the annular ring valve has a substantially uniform inner peripheral surface, thereby facilitating uniform processing conditions within the processing chamber when in the second position.

21. The method of claim 20, wherein the step of moving an annular ring valve comprises activating an actuator operatively coupled thereto, wherein the activated actuator exerts a force on the annular ring valve to move the ring valve from the first position to the second position.

22. The method of claim 21, wherein activating the actuator comprises turning one or more gears coupled to one or more screws, respectively, thereby rotating the screw, wherein the screw is coupled to the ring valve and the screw rotation alters a vertical position of the screw within the processing chamber, thereby altering a vertical position of the ring valve within the processing chamber.

23. The method of claim 20, further comprising the steps of transferring a wafer from a load lock chamber to the processing chamber through a transfer chamber.

24. The method of claim 23, further comprising the steps of:
   transferring a wafer to the load lock chamber, wherein at least a portion of the load lock chamber containing the wafer is fluidly isolated from the transfer chamber;
   changing a pressure in the portion of the load lock chamber to substantially equalize the pressure therein with a pressure in the transfer chamber;
   bringing the portion of the load lock chamber in fluid communication with the transfer chamber; and
   transferring the wafer from the load lock chamber to the processing chamber via the transfer chamber.

25. The method of claim 24, further comprising the step of lowering a load lock cover over the portion of the load lock chamber containing the wafer to fluidly isolate the portion from the transfer chamber.

26. The method of claim 24, wherein changing the pressure in the portion of the load lock chamber comprises evacuating an ambient environment from the load lock chamber portion using a pump until a pressure in the load lock chamber portion substantially equalizes the pressure in the transfer chamber.

27. A method of transferring a wafer to a wafer processing apparatus containing a load lock chamber and a processing chamber, comprising the steps of:
   fluidly isolating a portion of the load lock chamber from the processing chamber;
   inserting a wafer from an external wafer location to the portion of the load lock chamber;
   equalizing a pressure between the portion of the load lock chamber and the processing chamber;
   bringing the portion of the load lock chamber into fluid communication with the processing chamber;
   transferring the wafer from the load lock chamber to the processing chamber; and
   fluidly sealing the processing chamber from the load lock chamber via an annular ring valve.

28. The method of claim 27, wherein fluidly isolating the portion of the load lock chamber from the processing chamber comprises moving a load lock chamber cover from an open position to a closed position, wherein the load lock chamber cover in the closed position sealingly engages the portion of the load lock chamber.

29. The method of claim 28, wherein bringing the portion of the load lock chamber into fluid communication with the processing chamber comprises moving the load lock chamber cover from the closed position to the open position.

30. The method of claim 27, wherein fluidly sealing the processing chamber from the load lock chamber comprises moving the annular ring valve within the processing chamber from a first position to a second position, wherein the first ring valve position defines an annular spacing between a top interior portion and a bottom interior portion of the processing chamber and the second ring valve position couples the top and bottom portions together.

31. The method of claim 30, wherein the annular ring valve has a substantially uniform interior peripheral surface, thereby facilitating uniform processing conditions within the processing chamber.

32. A wafer processing apparatus, comprising:
   a processing chamber having an annularly separated top interior portion and a bottom interior portion, thereby defining an annular spacing therebetween; and
   an annular ring valve associated with one of the top interior portion and the bottom interior portion,
   the ring valve operable to open the processing chamber for access thereto in a first position and close the processing chamber for processing in a second position, wherein the ring valve is retracted from the annular spacing in the first position, thereby opening the processing chamber for access therethrough, and wherein the ring valve occupies the annular spacing in the second position, thereby coupling the top and bottom portions together by sealingly engaging the top and bottom portions, respectively, whereby a substantially uniform surface about an inner periphery of the closed processing chamber is provided, thereby facilitating uniformity in processing conditions therein.

33. The wafer processing apparatus of claim 32, wherein the ring valve in the second position extends from the one of the top chamber portion and the bottom chamber portion associated therewith and abuts the other of the top chamber portion and the bottom chamber portion, thereby coupling the top and bottom chamber portions together and substantially sealing the processing chamber from external conditions.

34. The wafer processing apparatus of claim 32, wherein the ring valve in the first position is retracted with respect to the other of the top chamber portion and the bottom chamber portion, thereby decoupling at least a portion of the top and bottom chamber portions corresponding to an access port for transfer or retrieval of a wafer to or from the processing chamber, respectively.

35. The wafer processing apparatus of claim 32, further comprising an actuation member operatively coupled to the ring valve, wherein the actuation member is operable to selectively position the ring valve in the first and second positions, respectively.

36. The wafer processing apparatus of claim 32, wherein the ring valve comprises a material which is substantially the same as a top and bottom chamber portion material, thereby providing a substantially uniform interior surface about the processing chamber over variations in interior chamber processing conditions.

37. The wafer processing apparatus of claim 32, wherein the processing chamber includes an access port and the wafer processing apparatus further comprises:

a transfer chamber operatively coupled to the processing chamber via the access port; and a load lock chamber operatively coupled to the transfer chamber, the load lock chamber including a load lock cover operable to move between two positions, wherein a first position isolates a portion of the load lock chamber from the transfer chamber, thereby allowing a pressure in the portion of the load lock chamber to differ from a pressure in the transfer chamber during a wafer transfer from an ambient pressure environment external the load lock chamber to the isolated portion of the load lock chamber, and wherein a second position of the load lock cover brings the portion of the load lock chamber into fluid communication with the transfer chamber for transfer of a wafer between the load lock chamber and the processing chamber.

38. The wafer processing apparatus of claim 37, further comprising a pump associated with the portion of the load lock chamber, wherein the pump is operable to reduce a pressure within the portion of the load lock chamber when the load lock cover is in the first position, thereby substantially matching a pressure in the portion of the load lock chamber with a pressure in the transfer chamber and the processing chamber.

39. The wafer processing apparatus of claim 32, wherein the processing chamber comprises an ion implantation processing chamber.

40. The wafer processing apparatus of claim 39, wherein the processing chamber comprises a plasma immersion ion implantation processing chamber.

41. A wafer processing apparatus, comprising:

a processing chamber having an access port for transferring a wafer thereto or retrieving a wafer therefrom; and a ring valve within the processing chamber, the ring valve operable to move between two positions, wherein the ring valve in the first position opens the access port for access to the processing chamber, and the ring valve in the second position is positioned to sealingly engage and thereby close the access port to prevent contamination of a wafer chamber processing environment, and wherein the ring valve has an annular shape with a substantially uniform inner peripheral surface, thereby providing a substantially uniform inner peripheral surface for the processing chamber thereat, thereby facilitating uniform processing conditions therein.

42. The wafer processing apparatus of claim 41, wherein a composition of the ring valve and the processing chamber is substantially the same.

43. The wafer processing apparatus of claim 41, wherein the processing chamber further comprises a top interior portion and a bottom interior portion annularly separated, thereby defining an annular spacing therebetween, and wherein the access port interfaces with a portion of the annular spacing to allow access to the processing chamber, and wherein the ring valve in the second position occupies the annular spacing, thereby coupling the top and bottom portions together by sealingly engaging the top and bottom portions, respectively.

44. The wafer processing apparatus of claim 43, wherein the bottom interior portion of the processing chamber includes an annular lip about an inner periphery thereof, and wherein the ring valve engages the annular lip in the first position.

45. The wafer processing apparatus of claim 41, further comprising an actuator operatively coupled to the ring valve, and operable to move the ring valve between the first and second positions, respectively.

46. The wafer processing apparatus of claim 45, wherein the actuator comprises one or more gear and screw assemblies, wherein the gear turns the screw which engages a bottom portion of the ring valve, and a turning of the screw adjusts a vertical position of the ring valve within the processing chamber.

47. The wafer processing apparatus of claim 41, further comprising:

a transfer chamber coupled to the processing chamber via the access port; and a load lock chamber coupled to the transfer chamber, the load lock chamber comprising:

an access port for receiving a wafer into the load lock chamber; and a selectively positionable isolation member within the load lock chamber, positionable between an isolation position and a non-isolation position, wherein in the isolation position the isolation member sealingly engages a portion of the load lock chamber associated with the load lock chamber access port, thereby permitting the transfer of a wafer to or from the load lock chamber via the load lock chamber access port without impacting processing conditions within the transfer chamber and the processing chamber, and wherein when the isolation member is in the non-isolation position the portion of the load lock chamber is in fluid communication with the transfer chamber, whereby the wafer can be transferred to the processing chamber.

48. The wafer processing apparatus of claim 47, further comprising an actuator operatively coupled to the isolation member, wherein the actuator is operable to selectively position the isolation member in the isolation position and the non-isolation position, respectively.

49. A method of accessing a wafer processing apparatus, comprising the steps of moving an annular ring valve within a processing chamber from a first position where the annular ring valve permits access to an access port of the processing chamber, to a second position where the annular ring valve sealingly blocks the access port, thereby prohibiting access to the processing chamber, wherein the annular ring valve has a substantially uniform inner peripheral surface, thereby facilitating uniform processing conditions within the processing chamber when in the second position.

50. The method of claim 49, wherein the step of moving an annular ring valve comprises activating an actuator operatively coupled thereto, wherein the activated actuator exerts a force on the annular ring valve to move the ring valve from the first position to the second position.

51. The method of claim 50, wherein activating the actuator comprises turning one or more gears coupled to one or more screws, respectively, thereby rotating the screw, wherein the screw is coupled to the ring valve and the screw rotation alters a vertical position of the screw within the processing chamber, thereby altering a vertical position of the ring valve within the processing chamber.

52. The method of claim 49, further comprising the steps of transferring a wafer from a load lock chamber to the processing chamber through a transfer chamber.

53. The method of claim 52, further comprising the steps of:
    transferring a wafer to the load lock chamber, wherein at least a portion of the load lock chamber containing the wafer is fluidly isolated from the transfer chamber;
    changing a pressure in the portion of the load lock chamber to substantially equalize the pressure therein with a pressure in the transfer chamber;
    bringing the portion of the load lock chamber into fluid communication with the transfer chamber; and
    transferring the wafer from the load lock chamber to the processing chamber via the transfer chamber.

54. The method of claim 53, further comprising the step of lowering a load lock cover over the portion of the load lock chamber containing the wafer to fluidly isolate the portion from the transfer chamber.

55. The method of claim 53, wherein changing the pressure in the portion of the load lock chamber comprises evacuating an ambient environment from the load lock chamber portion using a pump until a pressure in the load lock chamber portion substantially equalizes the pressure in the transfer chamber.

56. A method of transferring a wafer to a wafer processing apparatus containing a load lock chamber and a processing chamber, comprising the steps of:
    fluidly isolating a portion of the load lock chamber from the processing chamber;
    inserting a wafer from an external wafer location to the portion of the load lock chamber;
    equalizing a pressure between the portion of the load lock chamber and the processing chamber;
    bringing the portion of the load lock chamber into fluid communication with the processing chamber;
    transferring the wafer from the load lock chamber to the processing chamber; and
    fluidly sealing the processing chamber from the load lock chamber via an annular ring valve, wherein the annular ring valve has a substantially uniform interior peripheral surface, thereby facilitating uniform processing conditions within the processing chamber.

57. The method of claim 56, wherein fluidly isolating the portion of the load lock chamber from the processing chamber comprises moving a load lock chamber cover from an open position to a closed position, wherein the load lock chamber cover in the closed position sealingly engages the portion of the load lock chamber.

58. The method of claim 57, wherein bringing the portion of the load lock chamber into fluid communication with the processing chamber comprises moving the load lock chamber cover from the closed position to the open position.

59. The method of claim 56, wherein fluidly sealing the processing chamber from the load lock chamber comprises moving the annular ring valve within the processing chamber from a first position to a second position, wherein the first ring valve position defines an annular spacing between a top interior portion and a bottom interior portion of the processing chamber and the second ring valve position couples the top and bottom portions together.

* * * * *